United States Patent
Caudillo et al.

(10) Patent No.: US 10,879,446 B2
(45) Date of Patent: Dec. 29, 2020

(54) VERTICAL FLUX BIAS LINES COUPLED TO VERTICAL SQUID LOOPS IN SUPERCONDUCTING QUBITS

(71) Applicant: Intel Corporation, Santa Clara, CA (US)

(72) Inventors: Roman Caudillo, Portland, OR (US); Lester Lampert, Portland, OR (US); David J. Michalak, Portland, OR (US); Jeanette M. Roberts, North Plains, OR (US); Ravi Pillarisetty, Portland, OR (US); Hubert C. George, Portland, OR (US); Nicole K. Thomas, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/102,780

(22) Filed: Aug. 14, 2018

(65) Prior Publication Data
US 2019/0044051 A1    Feb. 7, 2019

(51) Int. Cl.
*H01L 39/04*  (2006.01)
*H01L 39/22*  (2006.01)
(Continued)

(52) U.S. Cl.
CPC .......... *H01L 39/223* (2013.01); *G06N 10/00* (2019.01); *H01L 27/18* (2013.01); *H01L 39/025* (2013.01);
(Continued)

(58) Field of Classification Search
CPC ... H01L 27/18; H01L 39/025; H01L 39/2493; H01L 39/223
See application file for complete search history.

(56) References Cited

U.S. PATENT DOCUMENTS 4,525,730 A * 6/1985 Beha ................. H01L 39/223
                                                                257/36
5,355,085 A * 10/1994 Igarashi ............ G01R 33/0356
                                                                324/248
(Continued)

FOREIGN PATENT DOCUMENTS

WO   2017155531 A1   9/2017
WO   2017213638 A1   12/2017
(Continued)

OTHER PUBLICATIONS

PCT/US2017/06689 Dec. 17, 2017, High quality low loss vertical interconnection.
(Continued)

*Primary Examiner* — Fernando L Toledo
*Assistant Examiner* — Valerie N Newton
(74) *Attorney, Agent, or Firm* — Patent Capital Group

(57) ABSTRACT

Embodiments of the present disclosure relate to quantum circuit assemblies implementing superconducting qubits, e.g., transmons, in which SQUID loops and portions of FBLs configured to magnetically couple to the SQUID loops extend substantially vertically. In contrast to conventional implementations, for a vertical SQUID according to various embodiments of the present disclosure, a line that is perpendicular to the SQUID loop is parallel to the qubit substrate. A corresponding FBL is also provided in a vertical arrangement, in order to achieve efficient magnetic coupling to the vertical SQUID loop, by ensuring that at least a portion of the FBL designed to conduct current responsible for generating magnetic field for tuning qubit frequency is substantially perpendicular to the substrate.

25 Claims, 13 Drawing Sheets

(51) Int. Cl.
  *H01L 39/02* (2006.01)
  *H01L 27/18* (2006.01)
  *H01L 39/24* (2006.01)
  *G06N 10/00* (2019.01)
(52) U.S. Cl.
  CPC ........ *H01L 39/045* (2013.01); *H01L 39/2493* (2013.01)

(56) References Cited

U.S. PATENT DOCUMENTS

| | | |
|---|---|---|
| 2019/0006572 A1 | 1/2019 | Falcon et al. |
| 2019/0042964 A1 | 2/2019 | Elsherbini et al. |
| 2019/0042967 A1 | 2/2019 | Yoscovits et al. |
| 2019/0042968 A1 | 2/2019 | Lampert et al. |
| 2019/0043822 A1 | 2/2019 | Falcon et al. |
| 2019/0043919 A1 | 2/2019 | George et al. |
| 2019/0043951 A1 | 2/2019 | Thomas et al. |
| 2019/0043952 A1 | 2/2019 | Thomas et al. |
| 2019/0043968 A1 | 2/2019 | Lampert et al. |
| 2019/0043973 A1 | 2/2019 | George et al. |
| 2019/0043974 A1 | 2/2019 | Thomas et al. |
| 2019/0043975 A1 | 2/2019 | George et al. |
| 2019/0043989 A1 | 2/2019 | Thomas et al. |
| 2019/0044044 A1 | 2/2019 | Lampert et al. |
| 2019/0044045 A1 | 2/2019 | Thomas et al. |
| 2019/0044046 A1 | 2/2019 | Caudillo et al. |
| 2019/0044047 A1 | 2/2019 | Elsherbini et al. |
| 2019/0044048 A1 | 2/2019 | George et al. |
| 2019/0044049 A1 | 2/2019 | Thomas et al. |
| 2019/0044050 A1 | 2/2019 | Pillarisetty et al. |
| 2019/0044066 A1 | 2/2019 | Thomas et al. |
| 2019/0044668 A1 | 2/2019 | Elsherbini et al. |
| 2019/0065981 A1 * | 2/2019 | Chen ................ G06N 10/00 |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |
| 2019/0392352 A1 | 12/2019 | Lampert et al. |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | WO-2018182571 A1 * | 10/2018 ............. G06N 10/00 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |
| WO | 2019055038 A1 | 3/2019 |
| WO | 2019066840 A1 | 4/2019 |
| WO | 2019066843 A1 | 4/2019 |
| WO | 2019117883 A1 | 6/2019 |
| WO | 2019117929 A1 | 6/2019 |
| WO | 2019117930 A1 | 6/2019 |
| WO | 2019117972 A1 | 6/2019 |
| WO | 2019117973 A1 | 6/2019 |
| WO | 2019117974 A1 | 6/2019 |
| WO | 2019117975 A1 | 6/2019 |
| WO | 2019117977 A1 | 6/2019 |
| WO | 2019125348 A1 | 6/2019 |
| WO | 2019125423 A1 | 6/2019 |
| WO | 2019125456 A1 | 6/2019 |
| WO | 2019125498 A1 | 6/2019 |
| WO | 2019125499 A1 | 6/2019 |
| WO | 2019125500 A1 | 6/2019 |
| WO | 2019125501 A1 | 6/2019 |
| WO | 2019132963 A1 | 7/2019 |
| WO | 2019133027 A1 | 7/2019 |
| WO | 2019135769 A1 | 7/2019 |
| WO | 2019135770 A1 | 7/2019 |
| WO | 2019135771 A1 | 7/2019 |

OTHER PUBLICATIONS

PCT/US2017/066889 Dec. 17, 2017, High quality factor vertical resonators.
PCT/US2017/066888 Dec. 17, 2017, High quality low loss vertical interconnection Variation: multi-via structures.
U.S. Appl. No. 15/897,712, filed Feb. 15, 2018, Reduce Flux Cross Talk from Flux Bias Line Operation.
U.S. Appl. No. 16/011,829, filed Jun. 19, 2018, Quantum Circuit Assemblies With Vertically-Stacked Parallel-Plate Capacitors.
"Independent, extensible control of same-frequency superconducting qubits by selective broadcasting," Asaad et al., Netherlands Organisation for Applied Scientific Research, Aug. 28, 2015, 17 pages.

(56) References Cited

OTHER PUBLICATIONS

"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Surface loss simulations of superconducting coplanar waveguide resonators," Wenner et al, Applied Physics Letters 99, 113513 (2011), pp. 113513-1 through 3.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Scalable quantum circuit and control for a superconducting surface code," Versluis et al, Netherlands Organisation for Applied Scientific Research, Dec. 28, 2016, 9 pages.
"Suspending superconducting qubits by silicon micromachining," Chu et al., Department of Applied Physics, Yale University, Jun. 10, 2016, 10 pages.

\* cited by examiner

US 10,879,446 B2

VERTICAL FLUX BIAS LINES COUPLED TO VERTICAL SQUID LOOPS IN SUPERCONDUCTING QUBITS

TECHNICAL FIELD

This disclosure relates generally to the field of quantum computing, and more specifically, to superconducting quantum circuits/qubit devices.

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a non-trivial task because the unique quantum-mechanical phenomena in such circuits lead to unique considerations which never had to be dealt with in classical, non-quantum, circuits, e.g., taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance and manufactured using existing process tools of leading edge device manufacturers also grows.

Superconducting qubits, e.g., transmon qubits (a particular class of superconducting qubits), are promising candidates for building a quantum computer. Superconducting quantum interference device (SQUID) loops and flux bias lines (FBLs) are important elements of such qubits.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
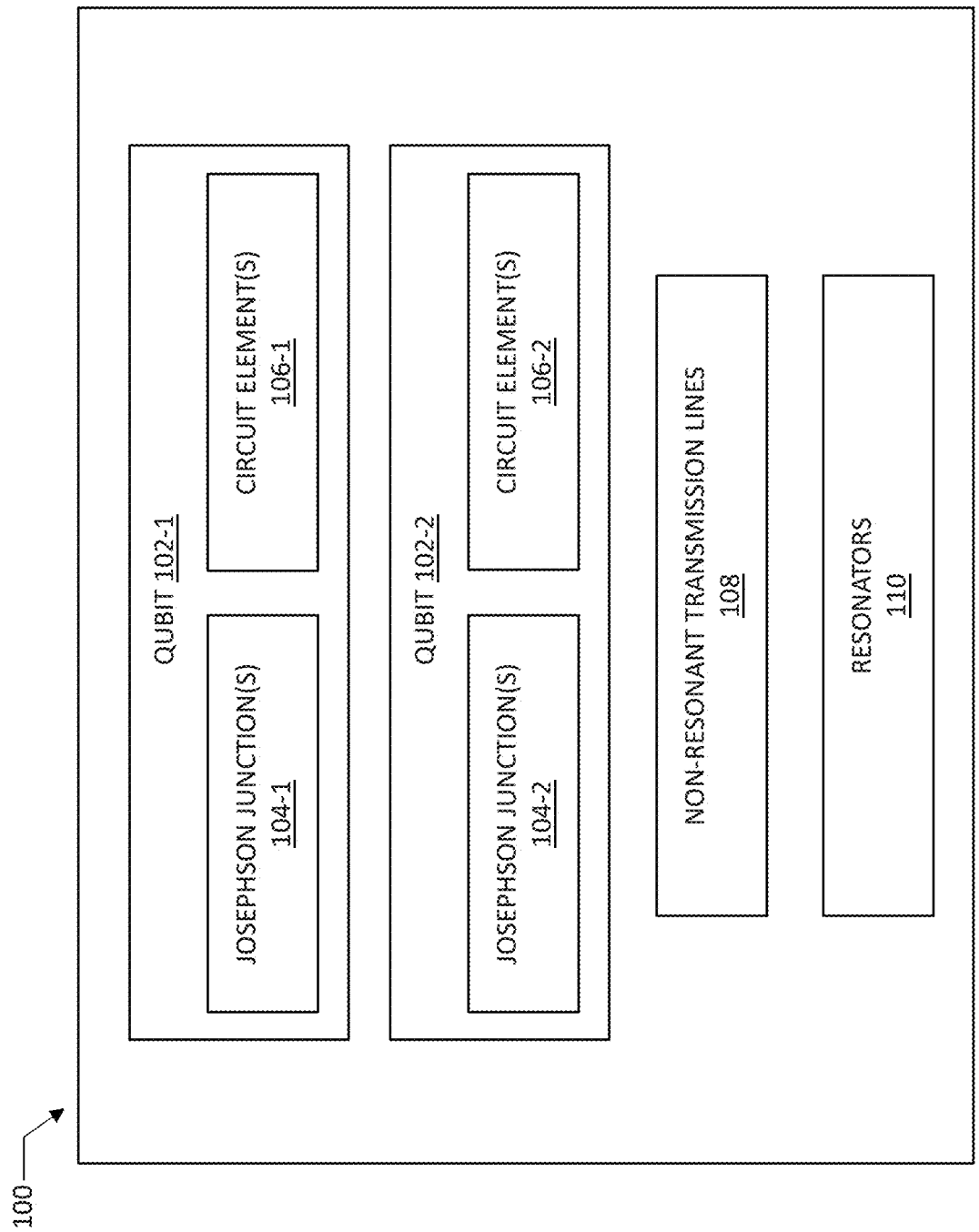
FIG. 1 provides a schematic illustration of a superconducting quantum circuit assembly, according to some embodiments of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e., superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits may be represented by a superposition of $2^N$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics). Therefore, both industry and academia continue to focus on a search for new and improved physical systems whose functionality could approach that expected of theoretically designed qubits. Physical systems for implementing qubits that have been explored until now include e.g., superconducting qubits (e.g., flux qubits or transmon qubits or simply "transmons"), semiconducting qubits including those made using quantum dots (e.g., spin qubits and charge qubits), photon polarization qubits, single trapped ion qubits, etc.

Out of the various physical implementations of qubits, superconducting qubits are promising candidates for building a quantum computer, where, in general, superconducting qubits refer to qubit devices that operate based on Josephson effect which is a macroscopic quantum phenomenon of supercurrent, i.e., a current that, due to zero electrical resistance, flows indefinitely long without any voltage applied, across a nonlinear inductive device known as a Josephson Junction. One challenge with qubits in general, and superconducting qubits in particular, remains in protecting qubits from decoherence (i.e., loss of state, and, therefore loss of information that a qubit is supposed to hold). For this reason, materials, fabrication methods, and layout designs used for building quantum circuits continuously focus on reducing spurious (i.e., unintentional and undesirable) two-level systems (TLS's), thought to be the dominant source of qubit decoherence, where, in general, as used in quantum mechanics, a two-level (also referred to as "two-state") system is a system that can exist in any quantum superposition of two independent and physically distinguishable quantum states.

Josephson Junctions are integral building blocks in quantum circuits employing superconducting qubit devices, forming the basis of quantum circuit elements that can approximate functionality of theoretically designed qubits. In particular, a pair of Josephson Junctions and a loop of a superconducting material (i.e., a superconducting loop) connecting them form a so-called SQUID or SQUID loop. Applying magnetic fields to the SQUID loop of a superconducting qubit allows controlling a frequency of the qubit which, in turn, allows controlling whether the qubit interacts with other components of a quantum circuit, e.g., with other qubits.

Applying magnetic fields to the SQUID region of a superconducting qubit is generally referred to as a "flux control" of a qubit. Such magnetic fields may be generated by providing direct current (DC) or a pulse of current through an electrically conductive line generally referred to as an FBL (also known as a "flux line" or a "flux coil line"). By providing an FBL sufficiently close to a SQUID loop (i.e., by providing at least a portion of an FBL proximate to a SQUID loop), magnetic field generated as a result of current running through the FBL may extend to the SQUID loop, thus tuning qubit frequency.

Generating a magnetic field that can tune the frequency of a qubit with sufficient degree of control while ensuring that this magnetic field does not affect other components of a quantum circuit/qubit device is not an easy task to begin with. Doing so in a manner that allows device scalability and use of manufacturing processes used by leading edge device manufactures makes the task that much more difficult. Therefore, improvements with respect to FBL and SQUID loop structures are always desirable.

Embodiments of the present disclosure relate to quantum circuit assemblies implementing superconducting qubits, e.g., transmons, in which SQUID loops and portions of FBLs configured to magnetically couple to the SQUID loops extend substantially vertically, i.e., in a direction that is substantially perpendicular to the qubit substrate (i.e., a substrate on which other (most) parts of qubit circuitry are implemented). Such an approach is counterintuitive to conventional implementations, which include providing a SQUID loop of a qubit device in a plane of the qubit substrate, and providing a corresponding FBL, configured to couple to the SQUID loop, also in the plane of the qubit substrate. In conventional implementations, a line that is perpendicular to the SQUID loop is perpendicular to the qubit substrate. In contrast, for a vertical SQUID according to various embodiments of the present disclosure, a line that is perpendicular to the SQUID loop is parallel to the qubit substrate. At least a portion of a corresponding FBL is also provided in a vertical arrangement, in order to achieve efficient magnetic coupling to the vertical SQUID loop, by ensuring that said portion of the FBL (namely, the portion that is designed to conduct current responsible for generating magnetic field configured to reach the SQUID loop to change qubit frequency) is substantially perpendicular to the substrate and is coplanar with or parallel to the plane of the SQUID loop.

It should be noted that terms indicating orientation of various elements, e.g., "vertical," "perpendicular," "orthogonal," or "parallel," refer to idealized scenarios which may not always be achievable in real life, e.g., due to fabrication limitations. Therefore, explanations provided herein using such terms are to be understood to include embodiments in which orientation of a given element may deviate from such an ideal orientation, e.g., deviate by, generally, +/−0-45%, e.g., by +/−5-15%, of a target angle value, based on the context of a particular value as described herein or as known in the art.

Quantum circuit assemblies implementing vertical FBLs and vertical SQUID loops as described herein may provide significant advantages over conventional implementations where FBLs and/or SQUID loops were provided in a qubit plane. For example, vertical SQUID loops as described herein may help reduce losses which lead to qubit decoherence and, thereby, increase coherence times of superconducting qubit devices due to the Josephson Junctions being moved further away from the potentially lossy material of the qubit substrate, compared to conventional implementations. Vertical FBLs as described herein may provide improvements over conventional FBLs in generating a magnetic field that can tune the frequency of a qubit with sufficient degree of control while ensuring that the magnetic field does not substantially affect other components of a quantum circuit placed at farther distance. Some embodiments of vertical FBLs described herein may be particularly suitable for improving grounding of FBLs, which may reduce crosstalk caused by the currents in such lines, which, in turn, may simplify qubit control, improve qubit fidelity, and improve overall microwave purity and quantum circuit performance. In addition, implementing vertical FBLs and vertical SQUID loops as described herein may advantageously facilitate use of three-dimensional (3D) and stacked designs for quantum circuit assemblies and may be particularly advantageous for realizing device scalability and use of 300-millimeter fabrication processes.

In this context of geometric considerations, the term "SQUID loop" refers to the plane of the SQUID loop, where a "plane of a SQUID loop" may be defined as a plane that intersects each of first superconductor electrode, tunnel barrier, and second superconductor electrode of the Josephson Junctions included in the SQUID loop. In various embodiments, such Josephson Junctions may be implemented as superconductor-insulator-superconductor (SIS) Josephson Junctions or superconductor-normal-superconductor (SNS) Josephson Junctions. Furthermore, as used herein, the term "line" in context of, e.g., FBLs described herein, does not necessarily imply a straight line. In fact, portions of any of the FBLs described herein may be formed with any suitable geometry according to various embodiments of the present disclosure, e.g., a straight line, a curved line, a loop, etc. In particular, some of the vertical FBLs described herein include center conductor lines forming partial loops, where the term "partial loop" refers to a shape of a line that is at least partially circular or/and curved over on itself. In other words, a partial loop formed by a portion of a line may trace out an area in a plane of the line that is nearly but not completely enclosed—e.g., a portion of a line may trace out at least 70% of the perimeter of any enclosed two-dimensional shape such as a square, triangle, circle, or any arbitrary closed shape. As used herein, the terms e.g., "FBL structure," "transmission line structure," "center conductor line structure," and "ground plane structure" may be referred to without using the word "structure." Furthermore, the term "center conductor line" may be used interchangeably with the terms such as "conductor strip," "signal path," or "signal line," as known in microwave engineering.

In order to provide substantially lossless connectivity to, from, and between the qubits, some or all of the electrically conductive portions of quantum circuit assemblies described herein, in particular vertical FBLs and electrodes of Josephson Junctions of vertical SQUID loops described herein, as well as other components of quantum circuits, may be made from one or more superconducting materials. However, some or all of these electrically conductive portions could be made from electrically conductive materials which are not superconducting. In the following, unless specified otherwise, reference to an electrically conductive material implies that a superconducting material can be used, and vice versa. Furthermore, materials described herein as "superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

While some descriptions are provided with reference to superconducting qubits, in particular to transmons, a particular class of superconducting qubits, at least some teachings of the present disclosure may be applicable to quantum circuit assembly implementations of any qubits, including superconducting qubits other than transmons and/or including qubits other than superconducting qubits, which may employ vertical FBLs and vertical SQUID loops as described herein, all of which implementations are within the scope of the present disclosure. For example, any of the vertical FBLs and vertical SQUID loops described herein may be used in hybrid semiconducting-superconducting quantum circuit assemblies.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g., "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g., "lossless" (or "low-loss") or "superconducting," are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-30 GHz, e.g., in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Example Quantum Circuit Assemblies with Superconducting Qubits

For purposes of illustrating certain example vertical FBLs and vertical SQUID loops described herein, it is important to understand in general how Josephson Junctions may be used in various quantum circuit assemblies. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides a schematic illustration of a quantum circuit assembly 100 that may include vertical FBLs and vertical SQUID loops, according to one embodiment of the present disclosure. For illustrative purposes, the quantum circuit assembly 100 is an example of a superconducting quantum circuit, e.g., a transmon circuit, which may include any of the vertical FBLs and vertical SQUID loops described herein.

The quantum circuit assembly 100 may include a plurality of qubits, represented in FIG. 1 as two qubits 102, e.g., superconducting qubits or transmon qubits. In the present FIGS., reference numerals following after a dash, e.g., qubit 102-1 and qubit 102-2 indicate different instances of the same or analogous element. Each of the qubits 102 may include one or more nonlinear inductive elements, e.g., Josephson Junctions, 104. Josephson Junctions are integral building blocks in superconducting quantum circuits where they form the basis of quantum circuit elements that can approximate functionality of theoretically designed qubits. In general, a Josephson Junction includes two superconductors coupled by a so-called weak link that weakens the superconductivity between the two superconductors. In quantum circuits, a weak link of a Josephson Junction may e.g., be implemented by providing a thin layer of an insulating material, a non-superconductive metal (also referred to as "normal" metal), or a semiconducting material, typically referred to as a "barrier" or a "tunnel barrier," sandwiched, in a stack-like arrangement, between two layers of superconductor, which two superconductors serve as a first and a second electrode of a Josephson Junction. The Josephson Junction provides a nonlinear inductive element to the circuit and allows the qubit to become an anharmonic oscillator. The anharmonicity is determined by the ratio of the charging energy, which stems from the total capacitance between a first and second element of the qubit, and the Josephson energy of the nonlinear inductive element (e.g., Josephson Junction). The anharmonicity is what allows the state of the qubit to be controlled to a high level of fidelity by creating a 2-level system, e.g., ground state and first excited state that have energy separation substantially different than first- and second-excited states or transitions between other higher-level excited states. In addition to controlling the anharmonicity, the ratio between charging and Josephson energies also control the qubit frequency. The charge noise of a superconducting qubit can be reduced by implementing a shunt capacitor in parallel to the Josephson Junction(s). A large shunt capacitance has the effect of reducing the charging energy. While this may come at the cost of reduced anharmonicity, the reduction in charge noise at the cost of reduced anharmonicity is often beneficial, and, when implemented in such a way so as to make the Josephson energy about 50 times greater than the charging energy (a regime typically referred to as the "transmon regime"), a qubit with enough anharmonicity can be maintained while simultaneously reducing charge noise and thus extending qubit coherence times.

Typically, when a qubit employs only one Josephson Junction, a frequency of the qubit cannot be changed substantially beyond what is defined by the design unless one of the qubit capacitive elements is tunable. Employing two or more Josephson Junctions, e.g., arranged in a SQUID loop, allows controlling the frequency of the qubit even without the presence of a tunable capacitive element. This allows greater control as to whether and when the qubit interacts with other components of a quantum circuit, e.g., with other qubits. In general, a SQUID of a superconducting qubit includes a pair of Josephson Junctions and a loop of a conductive, typically superconductive material (i.e., a superconducting loop), connecting a pair of Josephson Junctions. Applying a net magnetic field in a certain orientation to the SQUID loop of a superconducting qubit 102 allows controlling the frequency of the qubit 102. In particular, as briefly described above, applying magnetic field to the SQUID region of a superconducting qubit is generally referred to as a "flux control" of a qubit, and the magnetic field is generated by providing direct current (DC) and/or a relatively low frequency, typically below 1 GHz, current through an electrically conductive or superconductive line generally referred to as an FBL. By providing an FBL sufficiently close to the SQUID loop of the qubit 102, magnetic fields generated as a result of currents running through the FBL extend to the SQUID of the qubit 102, thus tuning the frequency of the qubit 102.

Turning back to FIG. 1, within each qubit 102, the one or more Josephson Junctions 104 may be directly electrically connected to one or more other circuit elements 106, which, in combination with the Josephson Junction(s) 104, form a nonlinear oscillator circuit providing multi-level quantum system where the first two to three levels define the qubit under normal operation. One example of the circuit elements 106 is shunt capacitors, i.e., capacitors connected in electrical parallel to one or more nonlinear inductive elements such as Josephson Junctions. In some embodiments, shunt capacitors may be implemented as vertically-stacked parallel plate capacitors described herein. In general, the circuit elements 106 may further include superconducting loops of a SQUID, electrodes for setting an overall capacitance of a qubit, or ports for capacitively coupling the qubit to one or more of a readout resonator, a coupling or "bus" component, and a direct microwave drive line, or/and ports for electromagnetically coupling the qubit to a flux bias line.

As also shown in FIG. 1, an example quantum circuit assembly 100 may include a plurality of non-resonant transmission lines 108, and, in some cases, a plurality of resonators 110.

The non-resonant transmission lines 108 are typically used for providing various signals, e.g., microwave signals, to different quantum circuit elements and components, which elements and components include e.g., readout resonators for various qubits, and may be considered to implement external readout and/or control of qubits. For example, for superconducting qubits, examples of the non-resonant transmission lines 108 include FBLs, microwave lines, and drive lines. On the other hand, the resonators 110 may be viewed as implementing internal control lines for qubits. For superconducting qubits, examples of the resonators 100 include coupling and readout resonators.

In general, a resonator 110 of a quantum circuit differs from a non-resonant microwave transmission line 108 in that a resonator is deliberately designed to support resonant oscillations (i.e., resonance), under certain conditions. In contrast, non-resonant transmission lines may be similar to conventional microwave transmission lines in that they are designed to avoid resonances, especially resonances at frequencies/wavelengths close to the resonant frequencies/wavelengths of any resonant object used in the quantum computing circuits, e.g., qubits, bus resonators, or readout resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible.

On-chip capacitive coupling between quantum or control elements can be achieved either through use of coupling components such as a coupling component on a neighboring qubit, a lumped element capacitor, a lumped element resonator, or a transmission line segment. A resonator is a transmission line segment that is made by employing fixed boundary conditions, and these boundary conditions control the frequencies/wavelengths which will resonate within a given transmission line segment used to implement a resonator. In order to satisfy boundary conditions for resonance, each end of a transmission line segment resonator can be either a node, if it is shorted to ground (e.g., where one end of the transmission line segment structure is electrically connected to a ground plane), or an antinode, if it is capacitively or inductively coupled to ground or to another quantum circuit element. Thus, resonators 110 differ from non-resonant microwave transmission lines 108 in how these lines are terminated at the relevant ends. A line used to route a signal on a substrate, i.e., one of the non-resonant transmission lines 108, typically extends from a specific source, e.g., a bonding pad or another type of electrical connection to a source, to a specific load (e.g., a short circuit proximate to SQUID loop, a quantum dot device, another bonding pad, or another electrical connection to a load). In other words, non-resonant transmission lines 108 terminate with electrical connections to sources, ground sinks, and/or loads. On the other hand, a transmission line resonator is typically composed of a piece of transmission line terminated with either two open circuits (in case of a half-wavelength resonator) or an open and a short circuit (in case of a quarter-wavelength resonator). In this case, for a desired resonant frequency, transmission line length may e.g., be a multiple of a microwave wavelength divided by 2 or 4, respectively. However, other terminations are possible, for example capacitive or inductive, and in this case the required line length to support resonance will be different from that identified above. For example, capacitive terminations may be used for resonators which are coupled to qubits, to a feedline, line, or to another resonator by a capacitive interaction.

Besides line termination by capacitive or inductive coupling or a short circuit, in order to support resonant oscillations, transmission line segments of the resonators 110 need to be of a specific length that can support such oscillations. That is why, often times, resonators 110 may be laid out on a substrate longer than the actual distance would require (i.e., a non-resonant transmission line would typically be laid out to cover the distance in the most compact manner possible, e.g., without any curves, wiggles, or excess length, while a resonator may need to have curves, wiggles, and be longer than the shortest distance between the two elements the resonator is supposed to couple in order to be sufficiently long to support resonance).

One type of the resonators 110 used with superconducting qubits are so-called coupling resonators (also known as "bus resonators"), which provide one manner for coupling different qubits together in order to realize quantum logic gates. These types of resonators are analogous in concept and have analogous underlying physics as readout resonators, except that a coupling or "bus" resonator involves only capacitive couplings between two or more qubits whereas a readout resonator involves capacitive coupling between one or more qubits and a feedline. A coupling resonator may be implemented as a microwave transmission line segment that includes capacitive or inductive connections to ground on both sides (e.g., a half-wavelength resonator), which results in oscillations (resonance) within the transmission line. While the ends of a coupling resonator have open circuits to the ground, each side of a coupling resonator is coupled, either capacitively or inductively, to a respective (i.e., different) qubit by being in the appropriate location and sufficient proximity to the qubit. Because different regions of a coupling resonator have coupling with a respective different qubit, the two qubits are coupled together through the coupling resonator. Thus, coupling resonators may be employed for implementing logic gates.

Another type of the resonators 110 used with superconducting qubits are so-called readout resonators, which may be used to read the state(s) of qubits. In some embodiments, a corresponding readout resonator may be provided for each qubit. A readout resonator, similar to the bus coupling resonator, is a transmission line segment. On one end it may have an open circuit connection to ground as well as any capacitively or inductively coupled connections to other quantum elements or a non-resonant microwave feedline. On the other end, a readout resonator may either have a capacitive connection to ground (for a half-wavelength resonator) or may have a short circuit to the ground (for a quarter-wavelength resonator), which also results in oscillations within the transmission line, with the resonant frequency of the oscillations being close to the frequency of the qubit. A readout resonator is coupled to a qubit by being in the appropriate location and sufficient proximity to the qubit, again, either through capacitive or inductive coupling. Due to a coupling between a readout resonator and a qubit, changes in the state of the qubit result in changes of the resonant frequency of the readout resonator. In turn, changes in the resonant frequency of the readout resonator can be read externally via connections which lead to external electronics e.g., wire or solder bonding pads.

For the non-resonant transmission lines 108, some descriptions of FBLs were provided above and, in the interests of brevity are not repeated here. In general, running a current through an FBL, provided e.g., from a wirebonding pads, solder bump, mechanical connector, or any other connection element, allows tuning (i.e., changing) the frequency of a corresponding qubit 102 to which a FBL is connected. As a result of running the current in a given FBL, magnetic field is created around the line. If such a magnetic field is in sufficient proximity to a given qubit 102, e.g., by a portion of the FBL being provided proximate (sufficiently close) to the SQUID loop of the qubit 102, the magnetic field generated around the FBL when the current runs through it couples to the qubit 102 (to the SQUID loop), thereby changing the Josephson energy and thus the spacing between the energy levels of the qubit. This, in turn, changes the frequency of the qubit since the frequency is directly related to the spacing between the energy levels via the equation $E=h\nu$ (Planck's equation), where E is the energy (in this case the energy difference between energy levels of a qubit), h is the Planck's constant and $\nu$ is the frequency (in this case the frequency of the qubit). As this equation illustrates, if E changes, then $\nu$ changes. Different currents and pulses of currents can be sent down each of the FBLs allowing for independent tuning of the various qubits 102.

Typically, the qubit frequency may be controlled in order to bring the frequency either closer to or further away from another resonant item, for example a coupling resonator or a coupled neighbor qubit, to implement multi-qubit interactions, as may be desired in a particular setting.

For example, if it is desirable that a first qubit 102-1 and a second qubit 102-2 interact, via a coupling resonator (i.e., an example of the resonators 110) connecting these qubits, then both qubits 102 may need to be tuned to be at nearly the same frequency. One way in which such two qubits could interact is that, if the frequency of the first qubit 102-1 is tuned very close to the resonant frequency of the coupling resonator, the first qubit can, when in the excited state, relax back down to the ground state by emitting a photon (similar to how an excited atom would relax) that would resonate within the coupling resonator. If the second qubit 102-2 is also at this energy (i.e., if the frequency of the second qubit is also tuned very close to the resonant frequency of the coupling resonator), then it can absorb the photon emitted from the first qubit, via the coupling resonator coupling these two qubits, and be excited from its ground state to an excited state. Thus, the two qubits may interact, or be entangled, in that a state of one qubit may be controlled by the state of another qubit. In other scenarios, two qubits could interact via exchange of virtual photons, where the qubits do not have to be tuned to be at the same frequency with one another. In general, two or more qubits could be configured to interact with one another by tuning their frequencies to specific values or ranges.

On the other hand, it may sometimes be desirable that two qubits coupled by a coupling resonator do not interact, i.e., that the qubits are independent. In this case, by applying magnetic flux, by means of controlling the current in the appropriate FBL, to one qubit it is possible to cause the frequency of the qubit to change enough so that the photon it could emit no longer has the right frequency to resonate on the coupling resonator or on the neighboring qubit via a virtual photon transfer through the bus. If there is nowhere for such a frequency-detuned photon to go, the qubit will be better isolated from its surroundings and will live longer in its current state. Thus, in general, two or more qubits could be configured to reduce interactions with one another by tuning their frequencies to specific values or ranges.

The state(s) of each qubit 102 may be read by way of its corresponding readout resonator of the resonators 110. As explained below, the state of qubit 102 induces a shift in the resonant frequency in the associated readout resonator. This shift in resonant frequency can then be read out using its coupling to a feedline. To that end, an individual readout resonator may be provided for each qubit. As described above, a readout resonator may be a transmission line segment that includes a capacitive connection to ground on one side and is either shorted to the ground on the other side (for a quarter-wavelength resonator) or has a capacitive connection to ground (for a half-wavelength resonator), which results in oscillations within the transmission line (resonance) that depends upon the state of a proximal qubit. A readout resonator may be coupled to its corresponding qubit 102 by being in an appropriate location and sufficient proximity to the qubit, more specifically in an appropriate location and sufficient proximity to a first element (or "island") of the qubit 102 that capacitively couples to the readout resonator, when the qubit is implemented as a transmon. Due to a coupling between the readout resonator and the qubit, changes in the state of the qubit result in changes of the resonant frequency of the readout resonator. In turn, by ensuring that the readout resonator is in sufficient proximity to a corresponding microwave feedline, changes in the resonant frequency of the readout resonator induce changes in the transmission coefficients of the microwave feedline which may be detected externally.

A coupling resonator, or, more generally, a coupling component, allows coupling different qubits together, e.g., as described above, in order to realize quantum logic gates. A coupling component could include a coupling component on a neighboring qubit, a lumped element capacitor, a lumped element resonator, or a transmission line segment. A coupling transmission line segment (e.g., coupling resonator or bus resonator) is similar to a readout resonator in that it is a transmission line segment that includes capacitive connections to various objects (e.g., qubits, ground, etc.) on both sides (i.e., a half-wavelength resonator), which also results in oscillations within the coupling resonator. Each side/end of a coupling component is coupled (again, either capacitively or inductively) to a respective qubit by being in appropriate location and sufficient proximity to the qubit, namely in sufficient proximity to a first element (or "island") of the qubit that capacitively couples to the coupling component, when the qubit is implemented as a transmon. Because each side of a given coupling component has coupling with a respective different qubit, the two qubits are coupled together through the coupling component. Thus, coupling components may be employed in order to implement multi-qubit interactions.

In some implementations, a microwave line (also sometimes referred to as a "microwave feedline") may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines may be used to only readout the state of the qubits as described above, while separate drive lines may be used to control the state of the qubits. In such implementations, microwave lines used for readout may be referred to as "microwave readout lines," while microwave lines used for controlling the quantum state of the qubits may be referred to as "microwave drive lines." Microwave drive lines may control the state of their respective qubits 102 by providing to the qubits a microwave pulse at or close to the qubit frequency, which in turn stimulates (i.e., triggers) a transition between the states of the qubit. By varying the length of this pulse, a partial transition can be stimulated, giving a superposition of the states of the qubit.

FBLs, microwave lines, readout lines, drive lines, coupling components, and readout resonators, such as e.g., those described above, together form interconnects for supporting propagation of microwave signals. Further, any other connections for providing direct electrical interconnection between different quantum circuit elements and components, such as e.g., connections from electrodes of Josephson Junctions to plates of the capacitors or to superconducting loops of SQUIDs or connections between two ground lines of a particular transmission line for equalizing electrostatic potential on the two ground lines, may also be referred to as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g., analog-to-digital converters, mixers, multiplexers, amplifiers, etc.

In various embodiments, various conductive circuit elements of supporting circuitry included in a quantum circuit such as the quantum circuit assembly 100 could have different shapes and layouts. In general, the term "line" as used herein in context of signal lines or transmission lines does not imply straight lines, unless specifically stated so. For example, some resonant or non-resonant transmission lines or parts thereof (e.g., conductor strips of resonant or non-resonant transmission lines) may comprise more curves, wiggles, and turns while other resonant or non-resonant transmission lines or parts thereof may comprise less curves, wiggles, and turns, and some transmission lines or parts thereof may comprise substantially straight lines.

The qubits 102, the non-resonant transmission lines 108, and the resonators 110 of the quantum circuit assembly 100 may be provided on, over, or at least partially embedded in a substrate (not shown in FIG. 1, but shown e.g., in FIGS. 2-9). The substrate may be any substrate suitable for realizing quantum circuit assemblies described herein.

In general, vertical FBLs described herein may be implemented as FBLs of the non-resonant transmission lines 108 and vertical SQUID loops described herein may be implemented as SQUID loops formed with the Josephson Junctions 104 of the qubits 102 in the quantum circuit assembly 100. In various embodiments, quantum circuit assemblies with vertical FBLs and vertical SQUID loops, such as the assembly shown in FIG. 1, may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

Vertical SQUID Loops

Figure 2:
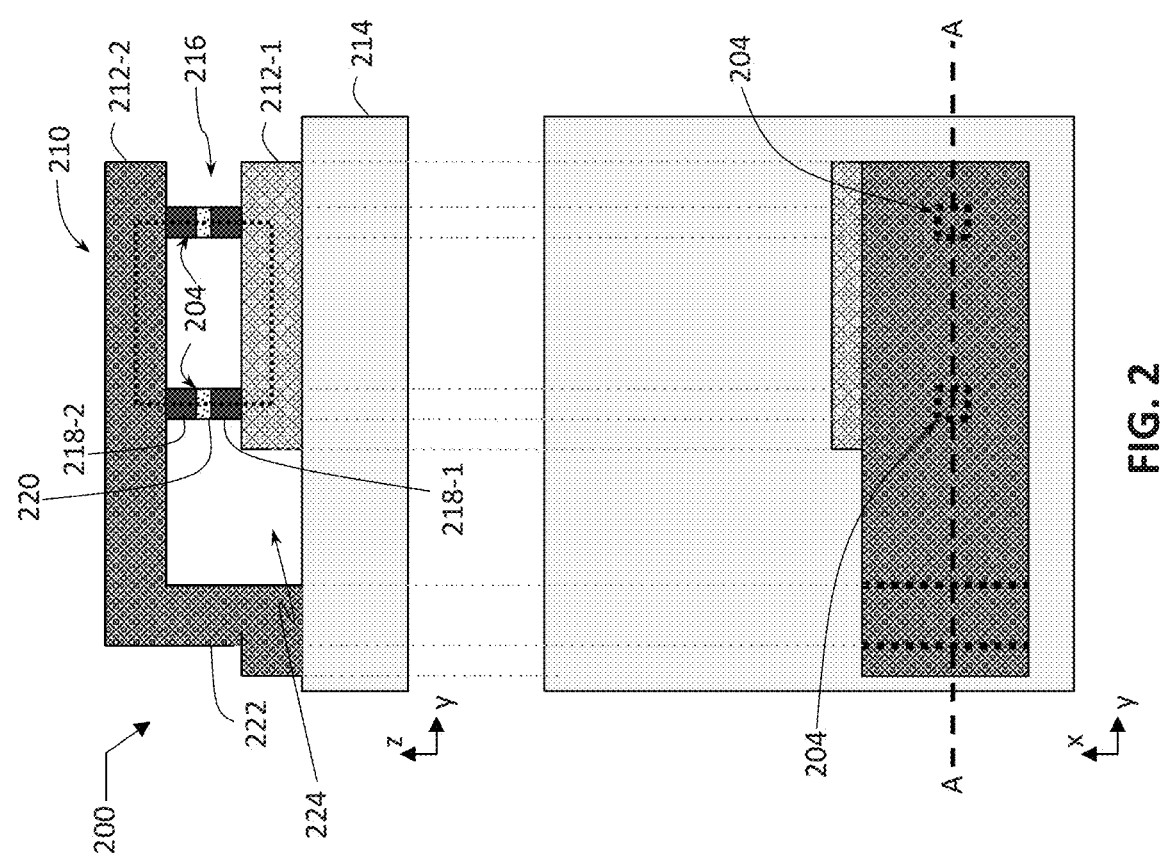
FIG. 2 illustrates a first example of cross-sectional and top-down views of a quantum circuit assembly with a vertical SQUID loop, according to some embodiments of the present disclosure.
Figure 3:
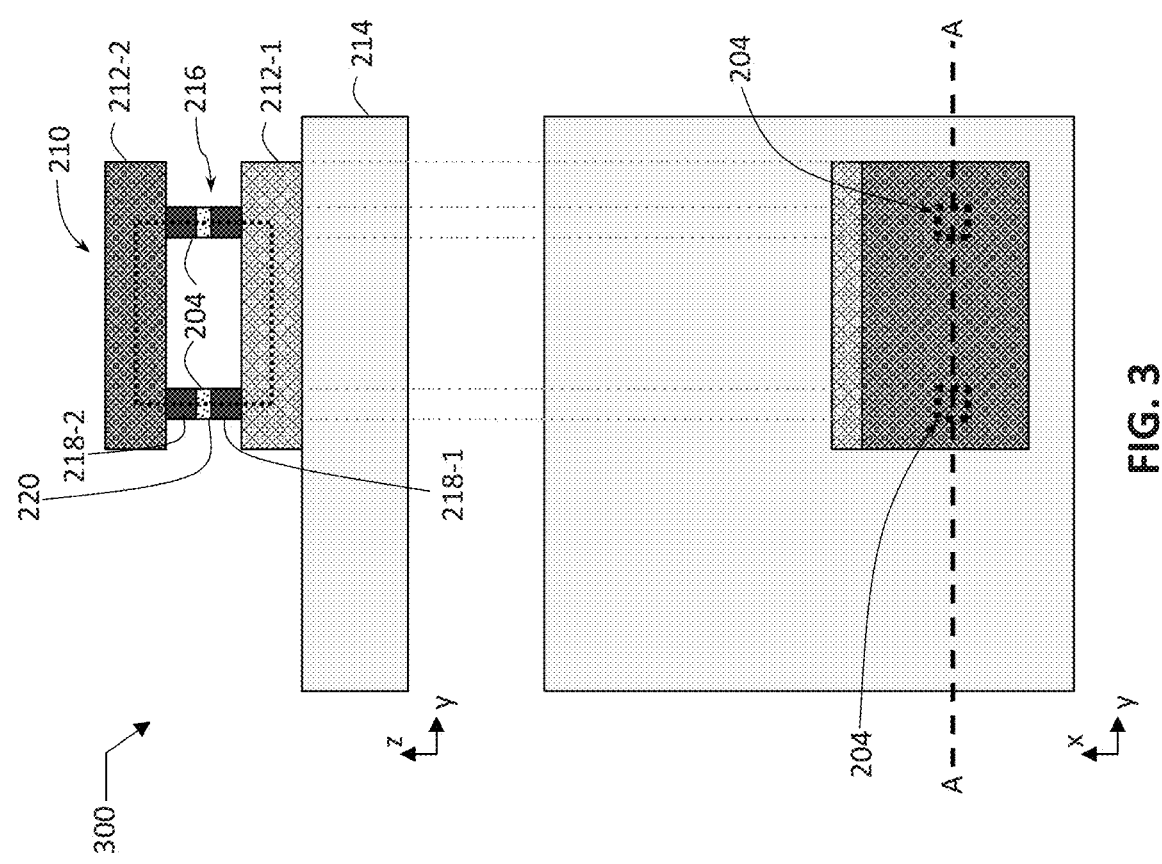
FIG. 3 illustrates a second example of cross-sectional and top-down views of a quantum circuit assembly with a vertical SQUID loop, according to some embodiments of the present disclosure.

FIGS. 2 and 3 illustrates two different examples of cross-sectional and top-down views (upper and lower illustrations, respectively, shown in each of FIGS. 2 and 3) of quantum circuit assemblies with vertical SQUID loops, according to various embodiments of the present disclosure, while FIGS. 4-9 provide various views of example physical layouts of vertical SQUID loops and vertical FBLs in quantum circuit assemblies, according to various embodiments of the present disclosure. The quantum circuit assemblies shown in FIGS. 2-9 are examples of the quantum circuit assembly 100 shown in FIG. 1. Therefore, all descriptions provided with respect to the quantum circuit assembly 100 are applicable to FIGS. 2-9, unless specified otherwise.

The cross-sectional views shown in FIGS. 2-9 are views of a y-z plane of the example coordinate system shown in these FIGS., while the top-down views shown in FIGS. 2-9 are views of a y-x plane. The cross-sectional views shown may be seen as examples of views obtained when a cross-section is taken along a plane perpendicular to the plane of the drawings and including a line shown as a horizontal dashed line AA in the top-down view of FIGS. 2-4. Light grey dashed lines extending between some upper and lower illustrations in these FIGS. (e.g., shown in FIGS. 2-3) are provided to indicate correspondence in scale between the various elements shown.

In FIGS. 2-9, same reference numerals are used to indicate functionally analogous elements, although, as explained below, their configuration may be different according to different embodiments shown in these FIGS. Different patterns are used in FIGS. 2-9 to illustrate materials that may be different materials. In particular, a single pattern used to show elements labeled with different reference numerals in each of these FIGS. is intended to illustrate that these elements, or portions, may be made from the same material. For example, FIG. 2 illustrates that a cantilever support portion 234 may be made from the same material as a second superconductor element 212-2. While first and second superconductor elements 212-1 and 212-2 are shown in some of FIGS. 2-9 with different patterns, in some embodiments, they may be implemented from the same electrically conductive, preferably superconductive, material.

Turning to FIG. 2, FIG. 2 illustrates a quantum circuit assembly 200 showing a vertical SQUID loop 210 of a single qubit 102, provided over a substrate 214. The substrate 214 may be any substrate suitable for realizing quantum circuit assemblies described herein. In one implementation, the substrate 214 may be a crystalline substrate such as, but not limited to a silicon or a sapphire substrate, and may be provided as a wafer or a portion thereof. In other implementations, the substrate 214 may be non-crystalline. In general, any material that provides sufficient advantages (e.g., sufficiently good electrical isolation and/or ability to apply known fabrication and processing techniques) to outweigh the possible disadvantages (e.g., negative effects of spurious TLS's), and that may serve as a foundation upon which a quantum circuit may be built, falls within the spirit and scope of the present disclosure. Additional examples of substrates that may be used as the substrate 214 include silicon-on-insulator (SOI) substrates, III-V substrates, and quartz substrates.

As shown in FIG. 2, the SQUID loop 210 includes a first superconductor element 212-1 and a second superconductor element 212-2, the superconductor elements 212 being substantially parallel to one another and to the substrate 214, and separated from one another by a gap 216 in which two Josephson Junctions 204 (or, in general, two nonlinear inductive elements) are provided. Thus, the first and second superconductor elements 212-1 and 212-2 interconnect the two Josephson Junctions 204 to form a "loop" of the SQUID loop 210 (the loop illustrated in FIG. 2 with a dotted line shown in the cross-sectional view of plane y-z). In other words, the first and second superconductor elements 212 are separated from one another by the two Josephson Junctions 104.

Since the SQUID loop 210 is a SQUID loop of a single qubit 102, the two Josephson Junctions 204 are two Josephson Junctions of that one qubit 102, e.g., two Josephson Junctions of the Josephson Junctions 104-1 of the first qubit 102-1, or two Josephson Junctions of the Josephson Junctions 104-2 of the second qubit 102-2 shown in FIG. 1. Each of the Josephson Junctions 104 include a first and second electrodes 218, separated by a tunnel barrier 220 (only labeled for one of the Josephson Junctions 104 shown in FIG. 2 in order to not clutter the drawing). Thus, in contrast to conventional implementations of SQUID loops typically used in quantum circuit assemblies, the SQUID loop 210 is implemented in a vertical geometry, i.e., where the tunnel barrier 220 is stacked over the first electrode 218-1 (the one between the substrate 214 and the tunnel barrier 220), and the second electrode 218-2 is stacked over the tunnel barrier 220. In this manner, the second electrode 218-2 of each of the Josephson Junctions 104 is further away from the substrate 214 than the first electrode 218-1. The SQUID loop 210 may be electromagnetically coupled to a vertical FBL (not shown in FIG. 2, but shown in some of the subsequent FIGS.) that may be used to deliver varying magnetic flux and thereby tune the qubit frequency, as described herein.

Each of the superconductor elements 212-1 and 212-2 of the SQUID loop 210 may be made from any suitable electrically conductive, preferably superconductive material, some examples of which are listed above.

In some embodiments, superconductor elements 212-1 and 212-2 of the SQUID 210 may be used to implement the portions of, or be electrically coupled to, a shunt capacitor of a qubit, described above, i.e., the superconductor elements 212 may be vertically-stacked capacitor plates of a shunt capacitor of the qubit 102, the shunt capacitor connected in parallel to the Josephson Junctions 104 of the qubit 102. FIG. 2 illustrates an embodiment where the second superconductor element 212-2 forms a cantilever over the first superconductor element 212-1 in that the second superconductor element 212-2 may be supported on one side, by a cantilever support portion 222, which may be an extension of the second superconductor element 212-2, but is free on the other side. In this way, at least a portion of the second superconductor element 212-2 may be suspended over at least a portion of the first superconductor element 212-1. Vertical dotted lines shown in the top-down view in FIG. 2 illustrates change in height of the electrically conductive material of the second superconductor element 212-2 as the cantilever support portion 222 brings the second superconductor element 212-2 down to the substrate 214.

In other embodiments of the SQUID loop 210, not specifically shown in FIG. 2, the second superconductor element 212-2 may form a bridge over the first superconductor element 212-1, i.e., in the cross-sectional illustration of the SQUID loop 210 as shown in FIG. 3, there could be a cantilever support portion similar to the portion 222 but on the right side of the second superconductor element 212-2, extending the second superconductor element 212-2 down to the substrate 214 and, thus, forming a bridge over the first superconductor element 212-1. For example, in some such embodiments, the first superconductor element 212-1 may be shaped as a "finger" or a "stub" under the bridging second superconductor element 212-2.

In various embodiments, the distance between the first and second superconductor elements 212-1 and 212-2 (a dimension measured along the z-axis of the example coordinate system shown in the FIGS. 2-9, i.e., the size of the gap 216) may be between about 20 nm and 2000 nm, including all values and ranges therein, e.g., between about 30 nm and 1000 nm, or between about 40 nm and 200 nm. While the gap 216 is shown in FIG. 2 as an air/gas/vacuum gap, in other embodiments, the gap 216 could be filled with a liquid or a solid dielectric material.

In some embodiments, the Josephson Junctions 104 themselves may help provide sufficient mechanical support to at least a portion of the second superconductor element 212-2 that may be suspended over at least a portion of the first superconductor element 212-1. In other embodiments (not specifically illustrated in FIGS.), one or more additional support structures configured to provide mechanical support for the second superconductor element 212-2 may also be used, in addition to the two or more Josephson Junctions 104. Such additional support structures could extend between the first and second superconductor elements 212 and may be formed of, e.g., a suitable insulating material, e.g., any suitable low-k dielectric material, such as, but not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

As shown in FIG. 2, the first electrode 218-1 of each the Josephson Junctions 104 may be in contact with the first superconductor element 212-1, while the second electrode 218-2 may be in contact with the second superconductor element 212-2, with the tunnel barrier 220 provided between the two electrodes 218. When the superconductor elements 212 form capacitor plates of a shunt capacitor of the qubit 102, such a capacitor is coupled in electrical parallel to the two Josephson Junctions 104. In various embodiments, the electrodes 218 of the Josephson Junctions 104 may be made of any suitable superconductive material, e.g., aluminum, or any other suitable superconductive material some examples of which are described above, while the tunnel barrier 220 may be formed of any suitable insulator, normal metal, or semiconductor, depending on whether the Josephson Junction 104 is an SIS, SNS, or SSS Josephson Junction. In the embodiments when the Josephson Junction 104 is a SIS Josephson Junction, the tunnel barrier material 220 could be selected as any dielectric material of sufficiently high quality (i.e., low losses in terms of spurious TLS's), such as e.g., silicon oxide, hafnium oxide, magnesium oxide, or aluminum oxide.

Although not specifically shown in FIG. 2, in various other embodiments, the vertically-stacked superconductor elements 212-1 and 212-2 may be used to capacitively couple to other quantum circuit elements such as bus resonators, readout resonators, and/or direct microwave drive lines either through interdigitated capacitive elements in the same plane or vertically-stacked capacitive elements in stacked parallel planes.

FIG. 3 illustrates a quantum circuit assembly 300 that provides another example of a possible physical layout of a vertical SQUID loop in the quantum circuit assembly 100 of FIG. 1. In the interests of brevity, it can be assumed that, unless specified otherwise, descriptions provided with respect to the quantum circuit assembly 200 and, in particular, with respect to the SQUID loop 210 shown in FIG. 2, are applicable to the quantum circuit assembly 300 and, in particular, with respect to the SQUID loop 210 shown in FIG. 3, and therefore, are not repeated here. Only the differences, therefore, are described. To that end, the quantum circuit assembly 300 illustrates that, in some embodiments, the upper superconductor element of the vertical SQUID loop 210, in the example shown in FIG. 3—the second superconductor element 212-2 of the SQUID loop 210, does not have to be routed down to the substrate 214. Instead, any electrical connections that may need to be made to that superconductor element 212-1 (the electrical connections not specifically shown in FIG. 3 because it would depend on a specific quantum circuit design) may be made in the plane of that plate, i.e., above the qubit plane and above the substrate 214, or, in some embodiments, no electrical connections may need to be made.

Applicable to both FIGS. 2 and 3, in various embodiments of the vertically-stacked superconductor elements 212, their dimensions may depend on a particular qubit design, e.g., may depend on what kind of capacitive coupling is intended to be implemented using such superconductor element. To first order, the capacitance (C) between the superconductor elements 212 can be set by varying the area (A) of the portions of the superconductor elements 212 which are vertically stacked above one another (i.e., by varying the area A that is the area where the two superconductor elements 212 face one another) and by varying their distance of separation (d), where $C \approx \varepsilon \cdot A/d$. The capacitance between the two superconductor elements 212 may also be supplemented with a capacitance between other portions of the two superconductor elements 212 facing one another, e.g., by the capacitance in an area 224 shown in FIG. 2, or by the capacitance in the plane of the substrate 214, not specifically shown in FIGS. As described above, in general, all of these capacitances, in conjunction with the other capacitances to the bus resonators, readout resonators, direct microwave drive lines, etc., may be used to set the total capacitance of the qubit and thus the charging energy of the qubit.

Coupling of Vertical FBLs to Vertical SQUID Loops

FIGS. 4-9 provide various views of example physical layouts of vertical SQUID loops and vertical FBLs in quantum circuit assemblies, according to various embodiments of the present disclosure. In particular, FIGS. 4-9 illustrate the vertical SQUID loop 210 as shown in FIG. 3, but, in general, the vertical SQUID loop 210 in the quantum circuit assemblies of FIGS. 4-9 could be any of the embodiments of the vertical SQUID loop described above, as long as the two Josephson Junctions 204 of the vertical SQUID loop are arranged with respect to the vertical FBLs as shown in FIGS. 4-9. In the interests of brevity, it can be assumed that, unless specified otherwise, descriptions provided with respect to the quantum circuit assemblies 200 and 300 and, in particular, with respect to the SQUID loop 210 shown in FIGS. 2 and 3, are applicable to each of the quantum circuit assemblies shown in FIGS. 4-9 and, in particular, with respect to the SQUID loop 210 shown in FIGS. 4-9, and therefore, are not repeated here. Therefore, the description of FIGS. 4-9 focuses on the different arrangements of a vertical FBL 430 coupled to the SQUID loop 210. In order to not clutter the drawings of FIGS. 4-9, not all elements of the SQUID loop 210 are specifically labeled with reference numerals shown in FIGS. 2-3 (e.g., reference numerals 212-1 and 216 are not shown), but their descriptions are applicable to FIGS. 4-9 as well.

Figure 4:
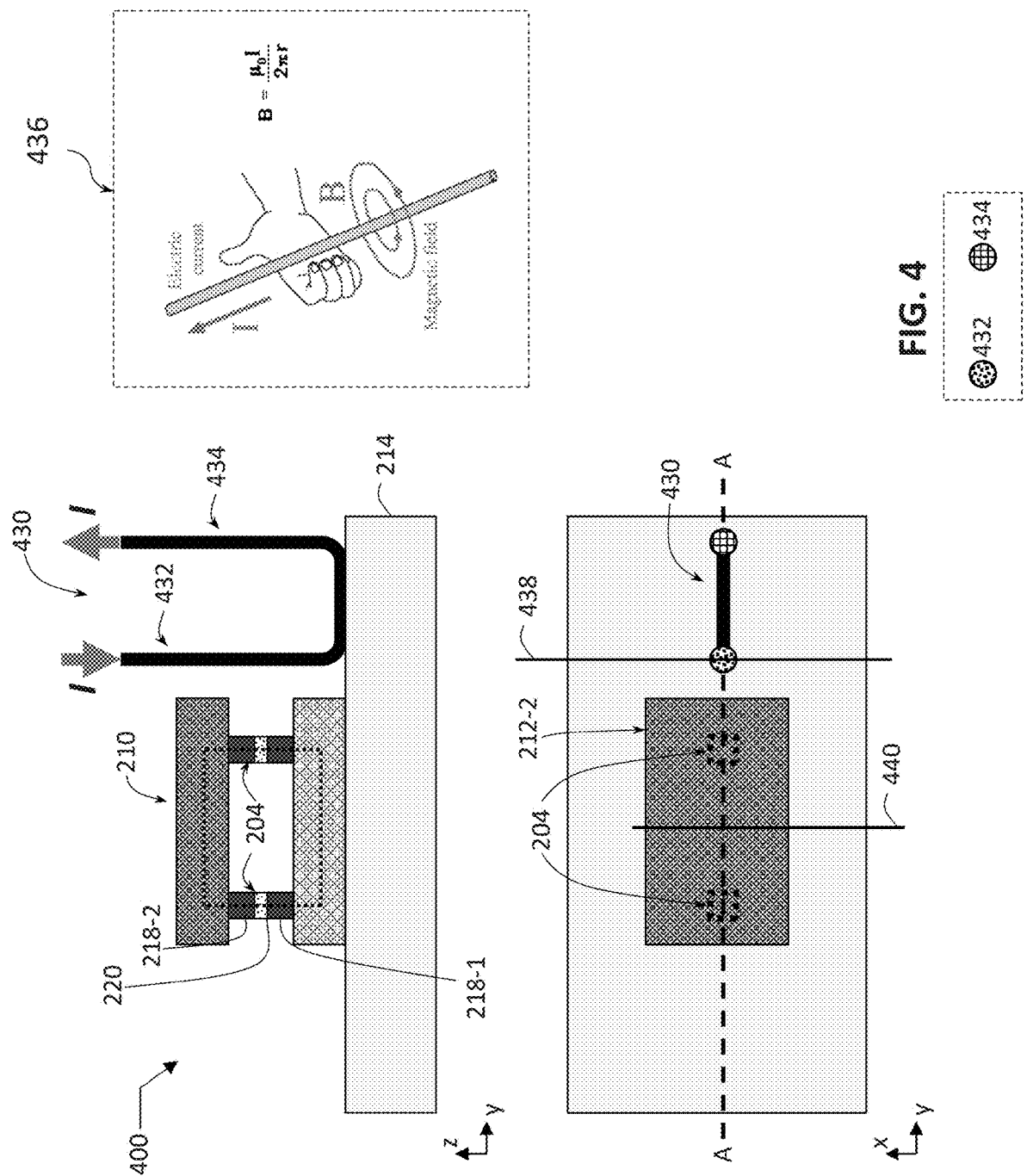
FIGS. 4-9 provide various example physical layout of a vertical SQUID loop and a vertical FBL in a quantum circuit assembly, according to various embodiments of the present disclosure.

Turning to FIG. 4, a quantum circuit assembly 400 illustrates a vertical FBL 430 may be placed near the SQUID loop 210. The FBL 430 is referred to as "vertical" because it includes at least one portion, namely a first FBL portion 432, which is a portion configured to provide the strongest magnetic coupling to the SQUID loop 210 (as explained in greater detail below), that is substantially perpendicular to the substrate 214. Phrased differently, the first FBL portion 432 is substantially perpendicular to the normal to the plane of the SQUID loop 210 (in FIG. 4, said normal is shown as a line 438 and the plane of the SQUID loop 210 is the plane AA) and extends away from the substrate 214 (i.e., is not in the plane of the substrate 214). It is worth repeating that, while the vertical SQUID loop 210 is "vertical" because it is intended that the plane of the SQUID loop 210 (said plane being the plane AA shown in FIG. 4) is perpendicular to the substrate 214 and that, similarly, while the vertical FBL 430 is "vertical" because it is intended that the first FBL portion 432 is perpendicular to the substrate 214, it may be that, in the final devices, the vertical SQUID loop 210 and/or the FBL 430 deviate from being "vertical" due to intentional or unintentional causes (the latter including, e.g., various unintended consequences of fabrication processes being used to fabricate these elements). Thus, in general, the plane of the SQUID loop 210 and/or the first FBL portion 432 may deviate from being exactly perpendicular to the substrate 214 by a certain tolerance, e.g., by an angle that is less than about 45 degrees, e.g., by less than about 20 degrees, or by less than about 10 or 5 degrees.

As described above, an FBL is configured to support conduction of electric current that is responsible for generating a magnetic field that, in turn, can reach the SQUID loop of a superconducting qubit, and tune the frequency of the qubit. The current can be provided to the FBL 430 from an external source, e.g., from a wirebonding pad or any other electrical connection to the die that houses the quantum circuit assembly 400. Such current may enter one portion of the FBL 430, e.g., the first portion 432, and exit another portion of the FBL 430, e.g., a second portion 434. In the cross-sectional view of FIG. 4, direction of the current that may flow in the FBL 430 is shown as arrows with a label "I" for current. In the top-down view of FIG. 4 and, analogously, in the top-down views shown in FIGS. 5-9, direction of the current in the first FBL part 432 and in the second FBL part 434 are shown with different patterns for which correspondence between the patterns and the first and second FBL parts 432, 432 is shown in the dashed box at the bottom of FIGS. 4-9. One of the patterns illustrates current going into the page of the top-down view of these FIGS. (e.g., the pattern for the first FBL portion 432), while the other pattern illustrates current going out of the page of the top-down view of these FIGS. (e.g., the pattern for the second FBL 434). In other embodiments, these directions can be reversed, i.e., the current I could go into the FBL 430 in the second FBL 434 part and come out in the first FBL part 432. As a result of the current flowing through the FBL 430, magnetic field is generated around the FBL 430 according to the right-hand rule. An inset 436 in FIG. 4 illustrates the right-hand rule. In various embodiments of the vertical FBLs described herein, ground conductors may be provided as well, but they are not specifically shown in FIGS. 4-9, which FIGS. illustrate only the center conductor line/signal line as the FBL 430.

In general, it may be desirable to avoid, or at least minimize, coupling from the second FBL portion 434 to the SQUID loop 210 so that tuning of the frequency of the qubit 102 that includes the SQUID loop 210 is performed by controlling the magnetic field generated due to the current in the first FBL portion 432. FIG. 4 illustrates an embodiment where the second FBL portion 434 is provided further away from the SQUID loop 210 and, therefore, couples less strongly to the SQUID loop 210 than the first FBL portion 432.

By providing the first FBL portion 432 in the plane of the SQUID loop 210, i.e., in the plane AA as shown in the top-down view of FIG. 4, coupling of the magnetic field generated due to the current in the first FBL portion 432 may be increased or maximized. The closer the first FBL portion 432 is to the SQUID loop 210, the stronger the coupling (because the closer the first FBL portion 432 is to the SQUID loop 210, the stronger is the magnetic field from the first FBL portion 432 that reaches the SQUID loop 210). In some embodiments of the arrangement of FIG. 4, the distance from the first FBL portion 432 to the center of the SQUID loop 210, as e.g., defined by the line 440 shown in the top-down view of FIG. 4, may be between about 25 and 500 micrometer (micron), including all values and ranges therein, e.g., between about 30 and 100 micron, or between about 40 and 60 micron. In some embodiments of the arrangement of FIG. 4, the distance from the second FBL portion 434 to the center 440 of the SQUID loop 210 may be between about 1 and 10,000 micron greater than the distance from the first FBL portion 432 to the center 440, including all values and ranges therein, e.g., between about 10 and 1000 micron greater, or between about 100 and 500 micron greater.

In general, moving the first FBL portion 432 away from the plane AA of the SQUID loop 210 decreases the coupling of the magnetic field generated by the current in the first FBL portion 432 to the SQUID loop 210, but may, nevertheless be advantageous in certain scenarios, e.g., because of fabrication considerations, as long as the coupling of the magnetic field generated by the current in other portions of the FBL 430 is smaller (e.g., as long as the coupling of the magnetic field generated by the second FBL portion 434 is smaller). In general, moving the second FBL portion 434 away from the plane AA of the SQUID loop 210 also decreases the coupling of the magnetic field generated by the current in the first FBL portion 432 to the SQUID loop 210, which is advantageous because it allows the coupling from the first FBL portion 432 to be the dominant one. Various embodiments of how the FBL 430 similar to that shown in FIG. 4 may be arranged with respect to the SQUID loop 210 are shown in FIGS. 5-9 showing modifications of the quantum circuit assembly 400 shown in FIG. 4 (therefore, descriptions provided with respect to FIG. 4 are applicable to FIGS. 5-9, unless stated otherwise, and only the differences between FIGS. 5-9 and FIG. 4 are explained below).

Figure 5:
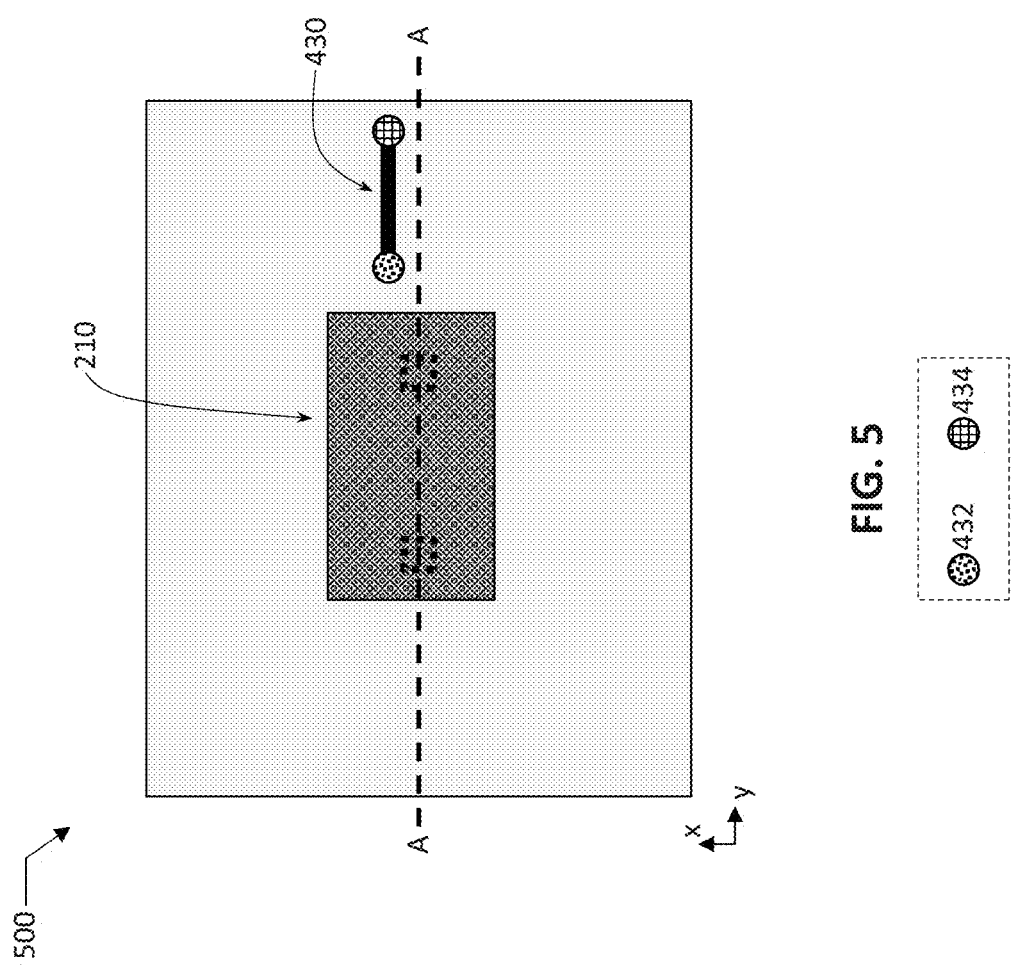

In particular, the quantum circuit assembly 500 shown in FIG. 5 illustrates that, in some embodiments, the entire FBL 430 may be shifted (translated) from the plane AA of the SQUID loop 210. While this will reduce coupling from the first FBL portion 432 to the SQUID loop 210 because the first FBL portion 432 is no longer in the plane of the SQUID loop 210, it will also advantageously reduce coupling from the second FBL portion 434.

Figure 6:
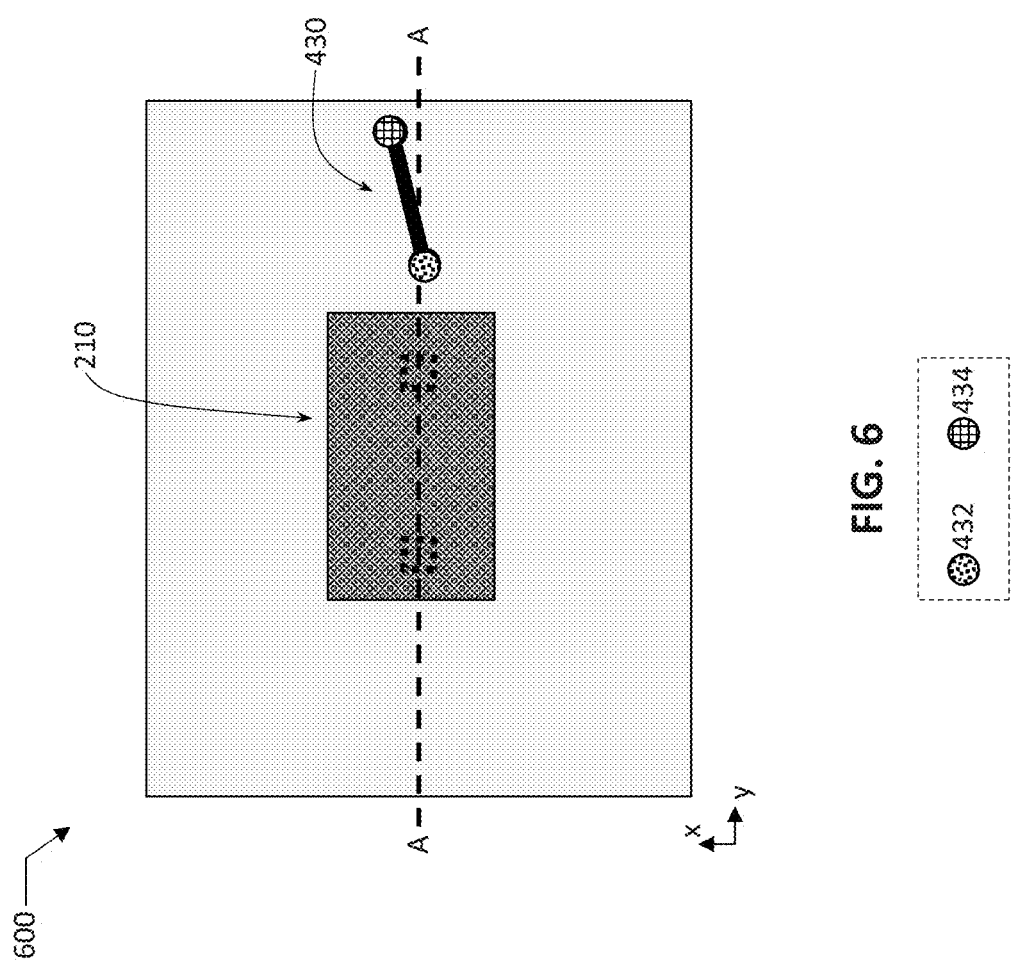

The quantum circuit assembly 600 shown in FIG. 6 illustrates that, in some embodiments, the second FBL portion 434 may be moved away from the plane AA of the SQUID loop 210, while the first FBL portion 432 may advantageously remain in the plane AA. This will advantageously reduce coupling from the second FBL portion 434 to the SQUID loop 210.

Figure 7:
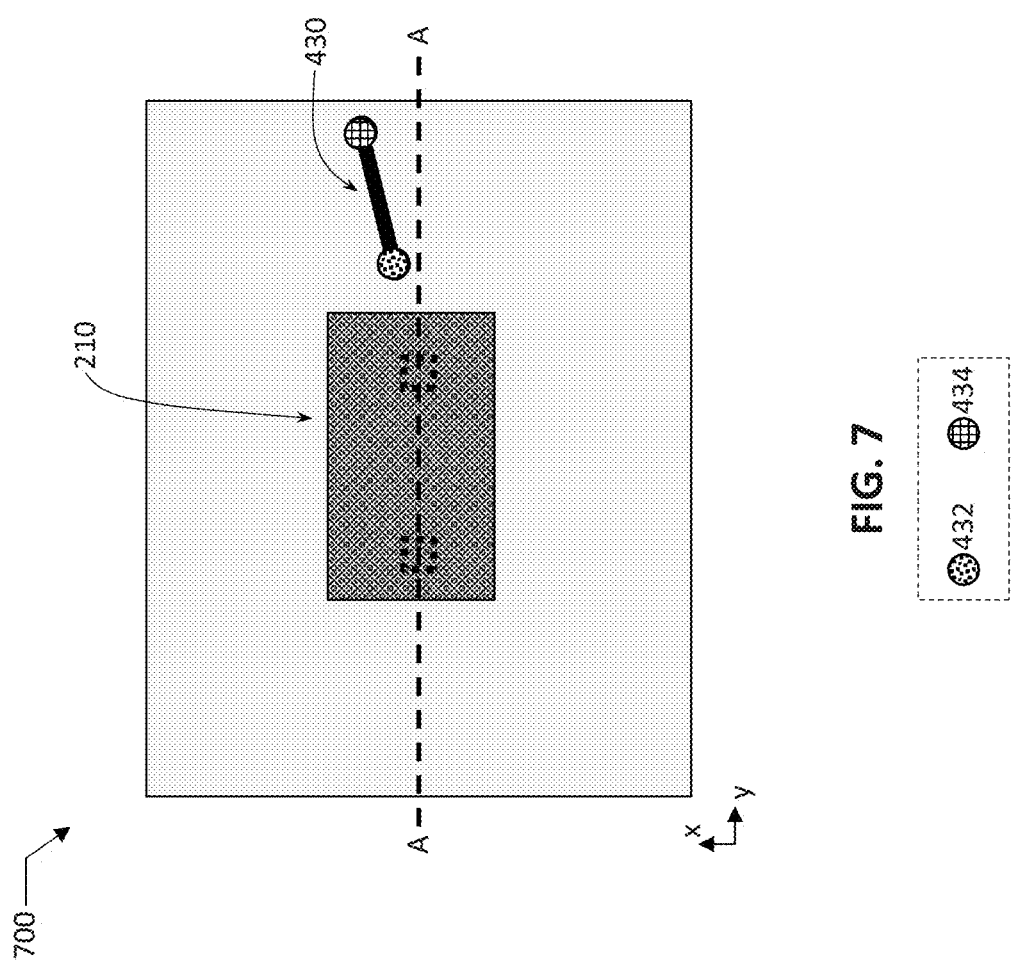

The quantum circuit assembly 700 shown in FIG. 7 illustrates that, in some embodiments, both the first FBL portion 432 and the second FBL portion 434 may be moved away from the plane AA of the SQUID loop 210, although to different distances (compared to e.g., the embodiment shown in FIG. 5). While this will reduce coupling from the first FBL portion 432 to the SQUID loop 210 because the first FBL portion 432 is no longer in the plane of the SQUID loop 210, it will also advantageously reduce coupling from the second FBL portion 434.

Figure 8:
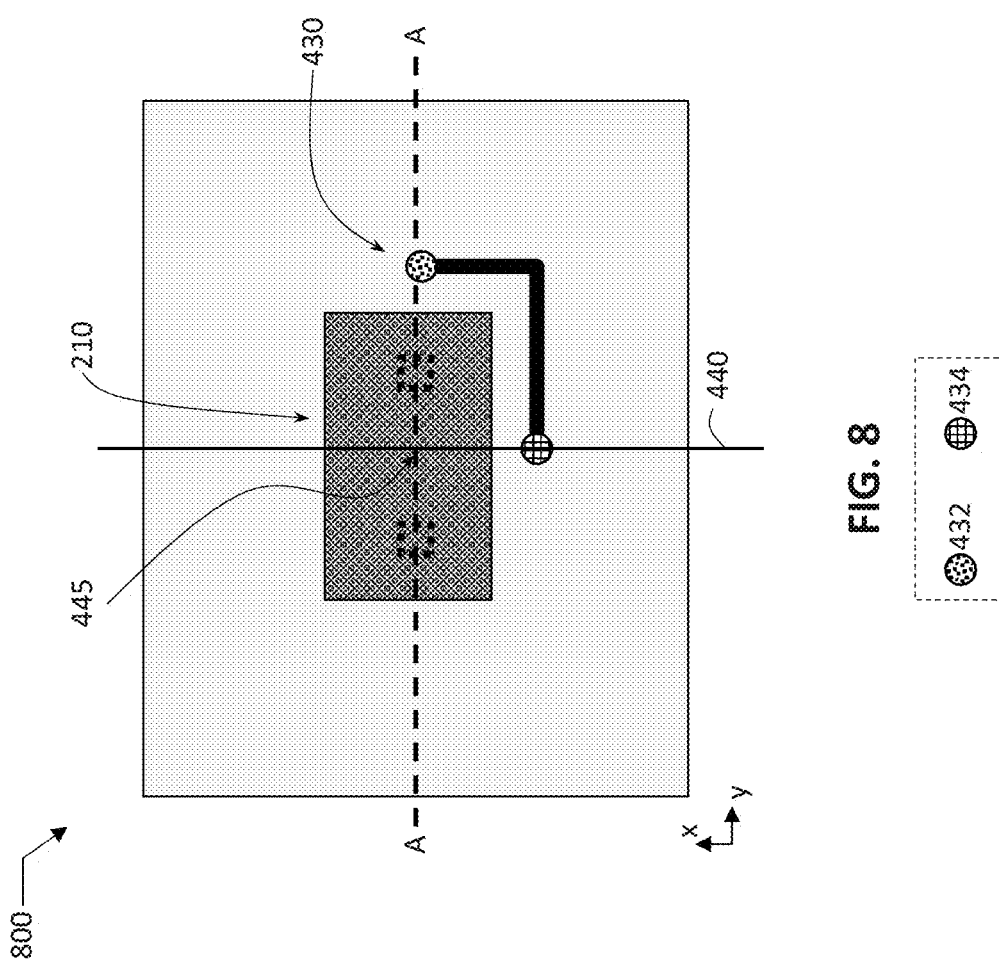

The quantum circuit assembly 800 shown in FIG. 8 illustrates what may be considered to be, theoretically, the most ideal embodiment of placement for the vertical portions of the FBL 430. In FIG. 8, the first FBL portion 432 may be maximally coupled, geometrically, to the SQUID loop 210 by virtue of being along the plane AA of the SQUID loop 210, while the second FBL portion 434 is minimally coupled, geometrically, by virtue of being along the plane of the line 440 (the plane being perpendicular to the substrate 214). In various other embodiments, all of which being within the scope of the present disclosure, each of the first FBL portion 432 and the second FBL portion 434 could be coupled to the SQUID loop 210 more or less than what is shown in FIG. 8, in terms of absolute coupling, by adjusting distance from these portions to center 445 of the SQUID loop 210. Thus, differentiation may be made between geometrical coupling and absolute coupling. Moving the first FBL portion 432 away from the plane AA of the SQUID loop 210 decreases its geometrical coupling to the SQUID loop 210 and moving the second FBL portion 434 away from the plane 440 increases its geometrical coupling (i.e., placing the second FBL portion 434 in the plane 440 minimizes its geometrical coupling). In terms of absolute coupling, moving each of the first FBL portion 432 and the second FBL portion 434 away from the geometric center 445 of the SQUID loop 210 decreases their coupling to the SQUID loop 210.

Figure 9:
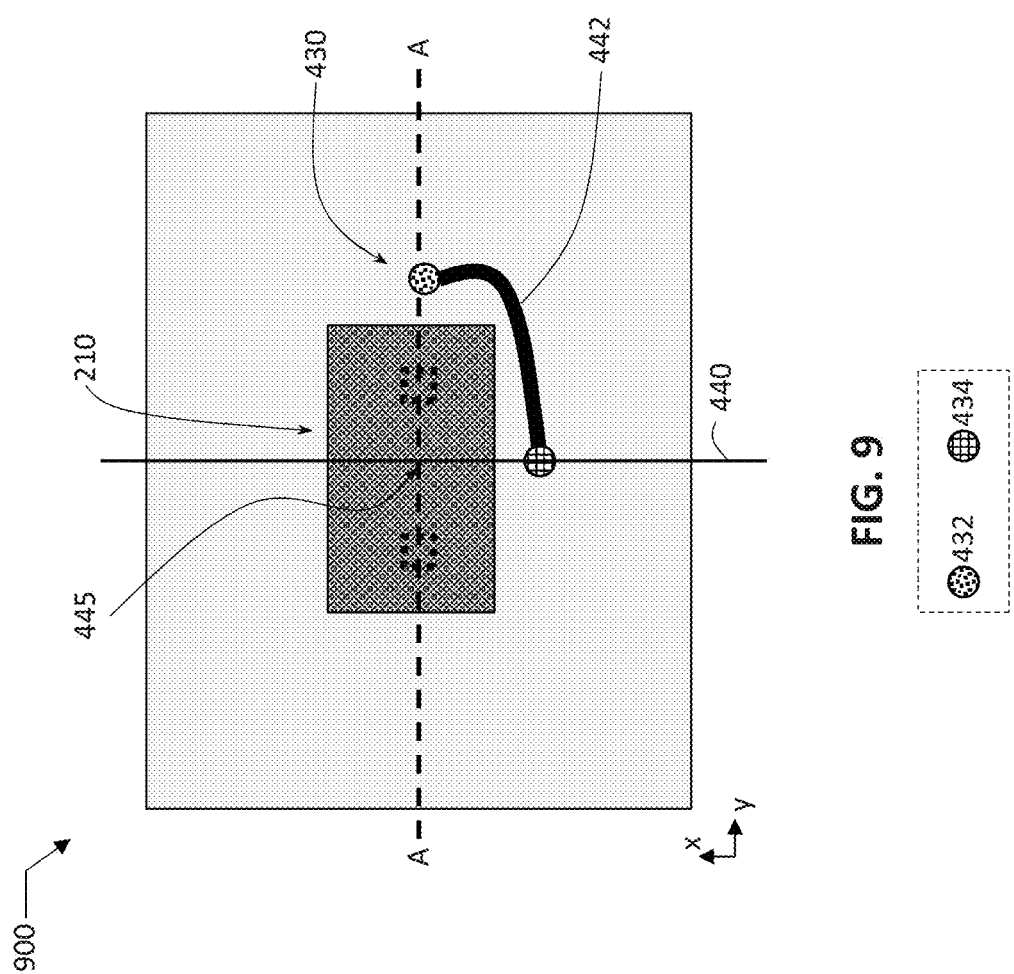

The quantum circuit assembly 900 shown in FIG. 9 illustrates an embodiment with the same placement of the first FBL portion 432 and the second FBL portion 434, i.e., the two vertical portions of the FBL 430, as shown in FIG. 8, but illustrating a different layout of a non-vertical FBL portion 442. In general, the exact layout of the non-vertical FBL portion 442 can be in any shape, e.g., selected as being the most convenient for a particular design and layout of the qubits and the associated circuitry as well as for adjusting coupling of the FBL 430 to the SQUID loop 210. In some embodiments, the non-vertical FBL portion 442 may be fabricated from the same base layer metals as the lower plane of the stacked superconducting qubit, e.g., from the same base layer metal as the first superconductor element 212-1, or may be fabricated from a different superconducting metal. Although not specifically shown in FIG. 9, the non-vertical FBL portion 442 may include multiple such portions. Considerations with respect to the non-vertical FBL portion 442 provided herein are applicable to all other embodiments of vertical FBLs described herein, e.g., to all other embodiments discussed with reference to FIGS. 4-8.

Variations and Implementations

Various quantum circuit assemblies described herein, e.g., the quantum circuit assemblies described with reference to FIGS. 2-9, do not represent an exhaustive set of quantum circuit assemblies that may utilize vertical SQUID loops and vertical FBLs but merely provide examples of such assemblies. Although particular arrangements of materials are discussed with reference to FIGS. 2-9 illustrating example quantum circuit assemblies, in some embodiments, various intermediate materials may be included in the vertical SQUID loops, vertical FBLs, and/or in other components of the quantum circuit assemblies of these FIGS. Note that FIGS. illustrating various views of example quantum circuit assemblies are intended to show relative arrangements of the components therein, and that quantum circuit assemblies of these FIGS. may include other components that are not illustrated (e.g., various interfacial layers between materials, various electrical connections to e.g., capacitor electrodes or other electrically conductive elements, etc.). Further, relative position of various components shown may be different—e.g., in some embodiments, the first superconductor element 212-1 may be partially buried in the substrate 214, e.g., be provided in a recess of the substrate 214. Additionally, although some components of the quantum circuit assemblies are illustrated in FIGS. 2-9 as being planar rectangles or formed of rectangular solids, this is simply for ease of illustration, and various components in other embodiments of these quantum circuit assemblies may be curved, rounded, or otherwise irregularly shaped as dictated by, and sometimes inevitable due to, the manufacturing processes used to fabricate the components or by design in order to reduce losses associated with strong electromagnetic fields at sharp corners and/or geometries.

Furthermore, in various embodiments, unless specified otherwise, any of the features discussed with reference to any of FIGS. 2-9 herein may be combined with any other features of these FIGS. to form a quantum circuit assembly with vertical SQUID loops and vertical FBLs. Some such combinations are described above. In another example of such a combination, a modified vertical FBL 430 may be substantially as the FBL 430 shown in any of FIGS. 2-8, but with the non-vertical FBL part 442 being not formed of straight lines, e.g., as shown in FIG. 9. In another example, a modified vertical FBL 430 may be substantially as the FBL 430 shown in any of FIGS. 8-9, but shifted and/or rotated (e.g., with respect to the first FBL portion 432) as shown in FIGS. 5-7. These particular combinations are simply examples, and, in further embodiments, any combination of features described herein, in particular of features described with referenced to FIGS. 2-9.

Still further, while FIGS. 4-9 illustrate the FBL 430 where current/comes in and out from a source/sink above the quantum circuit assembly, e.g., from a printed circuit board (PCB) substrate, in other embodiments, the FBL 430 may be configured to be connected to a ground connection on the qubit die. In such embodiments, the FBL 430 as described herein would not have the second vertical FBL portion 434 routing the current away from the substrate 216 but would terminate somewhere on the substrate 216.

In some such embodiments, the FBL 430 may be terminated with a connection to a common ground plane provided over the substrate 214. As is known in the art, common ground planes are typically used when a qubit die supports propagation of microwave signals in order to, e.g., suppress microwave parallel plate modes, cross-coupling between circuital blocks, and substrate resonant modes. In general, providing ground planes may improve signal quality, enable fast pulse excitation and improve the isolation between the different electrically conductive lines. Such ground planes could be provided in the plane of the qubits, in particular in the plane of the first superconductor element 212-1 of the SQUID loop 210, and are referred to as "common" because the ground is shared between several different superconducting circuit elements such as qubits and resonators.

In other such embodiments, the FBL 430 may be terminated with a connection to a designated ground connection provided over the qubit die. As used herein, an FBL ground connection that is electrically isolated from the common ground plane of the qubit die is referred to as a "designated" ground connection of an FBL because the connection is specific to the FBL and is not connected to the common ground plane. Terminating the FBL 430 with a designated ground connection on the qubit die, as opposed to terminating the FBL 430 by connecting it to the common ground plane of the qubit die, may improve grounding of the FBL 430, which may reduce crosstalk caused by the current in the FBL 430. In turn, reducing crosstalk may simplify qubit control, improve qubit fidelity, and improve overall microwave purity and quantum circuit performance.

What is common to all of the FBL structures described above is that a desired amount of current may be carefully controlled in the first vertical FBL portion 432 provided in the vicinity of the SQUID loop so that the magnetic field strength affecting the SQUID can be well-defined and, consequently, frequency of a qubit can be carefully tuned. The FBL structures described herein further allow controlling the current path as to reduce undesired and/or unknown magnetic fields. In various embodiments, the currents provided in the FBL 430 described herein to generate magnetic fields which are used to tune (change) the qubit frequency may be low frequency pulses, e.g., with a frequency lower than 1 GHz.

Example Packages and Devices

Figure 10:
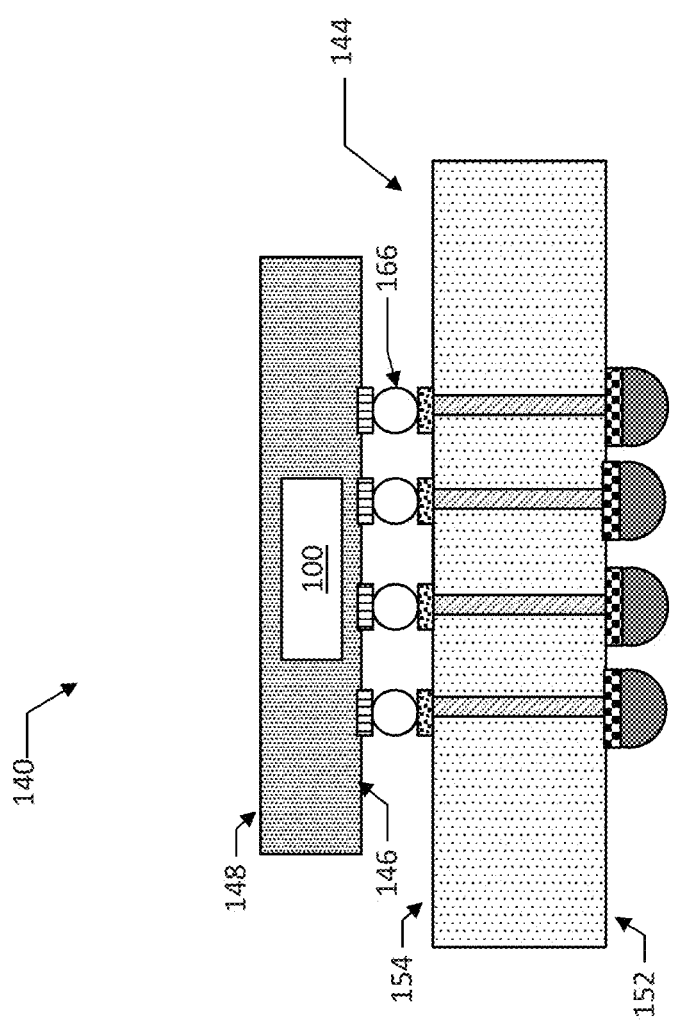
FIG. 10 provides a cross-sectional view illustrating a quantum circuit package that includes a qubit die that includes one or more quantum circuit assemblies with vertical FBLs and vertical SQUID loops as disclosed herein coupled to a package substrate, according to some embodiments of the present disclosure.

In various embodiments, quantum circuits with vertical SQUID loops and vertical FBLs as described herein may be included within a package. FIG. 10 provides a schematic illustration of an example superconducting (SC) qubit device package coupling a die implementing a quantum circuit assembly with any of vertical SQUID loops and vertical FBLs as described herein to a package substrate, according to some embodiments of the present disclosure.

FIG. 10 illustrates a SC qubit device package 140 in which the quantum circuit assembly 100 is included in a die 142, and the die 142 is coupled to a package substrate 144. The quantum circuit assembly 100 may be implemented as any of the quantum circuits as described above with reference to FIGS. 1-9 and may include vertical SQUID loops and vertical FBLs in one or more of the physical layouts described above.

A number of elements referred in the description of FIG. 10 with reference numerals are indicated in FIG. 10 with different patterns, with a legend showing the correspondence between the reference numerals and patterns being provided at the bottom of FIG. 10, and are not labeled in FIG. 10 with arrows pointing to them in order to not clutter the drawing. For example, the legend illustrates that FIG. 10 uses different patterns to show the die 142, the conductive contacts 150, 158, and 160, etc.

The die 142 may include a first face 146 and an opposing second face 148. Various components of the quantum circuit assembly 100 implemented on the die 142, e.g., the qubits 102 (in particular, the vertical SQUID loops 210 of any of the qubits 102) and the vertical FBLs (which may be designated for individual ones of the different qubits 102 or shared among two or more qubits), as well as various other non-resonant transmission lines 108 and the resonators 110, may be proximate to or provided on the first face 146, and conductive pathways may extend and be coupled between these elements and the conductive contacts 150 also disposed at the first face 146. The conductive pathways are not specifically shown in FIG. 10 because the details of the quantum circuit assembly 100 are not specifically shown in FIG. 10. In some embodiments, at least some of the conductive contacts 150 may be used to drive current in the FBLs 430 in the quantum circuit assembly 100, the current being provided from the package substrate 144. In various embodiments, the conductive contacts 150 may be formed of any suitable conductive material (e.g., a superconducting material). The conductive contacts 150 may take form of solder bond pads, but other first level interconnect structures may be used (e.g., conductive epoxies, anisotropic conductive films, copper to copper bonding posts, etc.) to route electrical signals to/from the die 142.

The package substrate 144 may include a first face 152 and an opposing second face 154. Conductive contacts 158 may, optionally, be disposed at the first face 152, and conductive contacts 160 may be disposed at the second face 154. Conductive pathways 162 may extend through an insulating material 164 of the package substrate 144 between the first face 152 and the second face 154 of the package substrate 144, electrically coupling various ones of the conductive contacts 158 to various ones of the conductive contacts 160, in any desired manner. The insulating material 164 may be a dielectric material (e.g., an ILD), and may take the form of any of the embodiments of the insulating materials disclosed herein, for example. The conductive pathways 162 may include one or more conductive vias, one or more conductive lines, or a combination of conductive vias and conductive lines, for example.

In some embodiments, the package substrate 144 may be or may otherwise include a silicon interposer, and the conductive pathways 162 may be through-silicon vias. Silicon may have a desirably low coefficient of thermal expansion compared with other dielectric materials that may be used for the insulating material 164, and thus may limit the degree to which the package substrate 144 expands and contracts during temperature changes relative to such other materials (e.g., polymers having higher coefficients of thermal expansion). A silicon interposer may also help the package substrate 144 achieve a desirably small line width and maintain high connection density to the die 142.

In some embodiments, the insulating material 164 of the package substrate 144 may be selected to be the same as the insulating material of the SC qubit die 142. In one implementation, the die 142 and the package substrate 144 may be a crystalline substrate such as, but not limited to a silicon or a sapphire substrate, and may be provided as a wafer or a portion thereof. In other implementations, the substrate may be non-crystalline. In general, any material that provides sufficient advantages (e.g., sufficiently good electrical isolation and/or ability to apply known fabrication and processing techniques) to outweigh the possible disadvantages (e.g., negative effects of various defects), and that may serve as a foundation upon which a quantum circuit may be built, falls within the spirit and scope of the present disclosure. Additional examples of substrates include SOI substrates, III-V substrates, and quartz substrates.

The conductive contacts 150 of the die 142 may be electrically coupled to the conductive contacts 160 of the package substrate 144 via first level interconnects 166. In some embodiments, the first level interconnects 166 may include solder bumps or balls, as illustrated in FIG. 10 by showing in FIG. 10 the first level interconnects 166 as white circles associated with the conductive contacts 160. In some embodiments, the first level interconnects 166 may be flip chip (or controlled collapse chip connection, C4) bumps disposed initially on the die 142 or on the package substrate 144. Second level interconnects 168 (e.g., solder balls or other types of interconnects) may couple the conductive contacts 158 on the first face 152 of the package substrate 144 to another component, such as a circuit board (not specifically shown in FIG. 10). Examples of arrangements of electronics packages that may include an embodiment of the SC qubit device package 140 are discussed below with reference to FIG. 12. The die 142 may be brought in contact with the package substrate 144 using a pick-and-place apparatus, for example, and a reflow or thermal compression bonding operation may be used to couple the die 142 to the package substrate 144 via the first level interconnects 166.

In some embodiments, the surface of the die around the contacts 150 may be coated with a material which is not wetted by the solder material 166. This material is generally known as a solder mask and can take any appropriate form, such as silicon nitride, aluminum oxide, and silicon oxide. The presence of this solder mask material enables solder mask defined contacts.

A solder resist material may be disposed around the conductive contacts 158 (not specifically shown in FIG. 10). The solder resist material may be a polyimide or similar material, or may be any appropriate type of packaging solder resist material. In some embodiments, the solder resist material may be a liquid or dry film material including photoimageable polymers. In some embodiments, the solder resist material may be non-photoimageable.

In various embodiments, more or fewer structures may be included in the conductive pathways and conductive contacts described with reference to FIG. 10. In some embodiments, conductive lines of the die 142 and the package substrate 144 may extend into and out of the plane of the drawing, providing conductive pathways to route electrical signals to and/or from various elements in the die 142.

As noted above, interconnect structures may be arranged within the quantum circuit assembly 100 and in the package substrate 144 to route electrical signals according to a wide variety of designs (in particular, the arrangement is not limited to the particular configuration of interconnect structures depicted in FIG. 10 or any of the other accompanying figures, and may include more or fewer interconnect structures). During operation of the quantum circuit assembly 100, electrical signals (e.g., power, input/output (I/O) signals, including various control signals for external and internal control of the qubits 102) may be routed to and/or from the qubits 102 of the quantum circuit assembly 100 through the interconnects provided by the conductive contacts and conductive pathways of the die 142 and the package substrate 144. When at least one vertical FBL as described herein is implemented in the package 140, at least some of the conductive contacts and conductive pathways of the die 142 and the package substrate 144 may be used to provide a designated ground connection for such a flux bias line.

In various embodiments, quantum circuits with FBLs as described above may be fabricated using any suitable fabrication techniques.

Quantum circuit assemblies/structures incorporating vertical SQUID loops and vertical FBLs as described above may be included in any kind of qubit devices or quantum processing devices/structures. Some examples of such devices/structures are illustrated in FIGS. 11A-11B, 12, and 13.

Figure 11B:
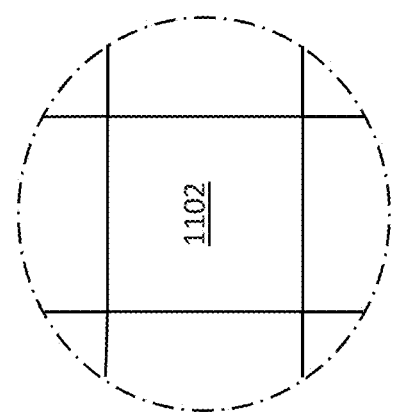
FIGS. 11A and 11B are top views of a wafer and dies that may include one or more quantum circuit assemblies with vertical FBLs and vertical SQUID loops disclosed herein, in accordance with various embodiments.
Figure 11A:
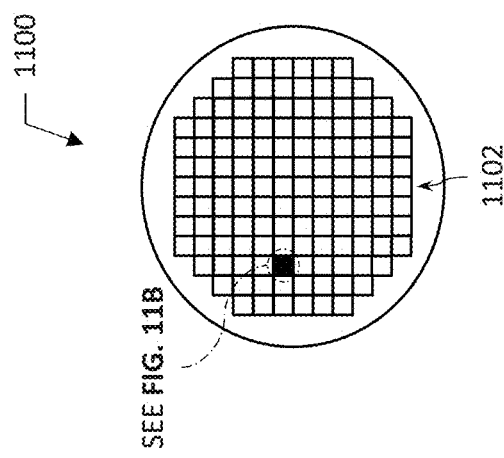

FIGS. 11A-11B are top-down views of a wafer 1100 and dies 1102 that may be formed from the wafer 1100, according to some embodiments of the present disclosure. The dies 1102 may include any of the quantum circuit assemblies disclosed herein, e.g., quantum circuit assemblies comprising superconducting qubits implementing vertical SQUID loops and vertical FBLs as described herein, e.g., any of the quantum circuit assemblies described with reference to FIGS. 1-9. In particular, the wafer 1100 may be any the form of the qubit substrates as proposed herein, and may further include one or more dies 1102 having conventional and quantum circuit device elements formed on a surface of the wafer 1100. Each of the dies 1102 may be a repeating unit of a semiconductor product that includes any suitable conventional and/or quantum circuit qubit device. In some embodiments, one or more of the dies 1102 may be implemented as the die 142, shown in FIG. 10 and described above. After the fabrication of the semiconductor product is complete, the wafer 1100 may undergo a singulation process in which each of the dies 1102 is separated from one another to provide discrete "chips" of the semiconductor product. A die 1102 may include one or more quantum circuit assemblies 100, including any supporting conductive circuitry to route electrical signals within the quantum circuit assemblies 100, as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 13) or other logic that is configured to store information in the memory devices or execute instructions stored in the memory array.

Figure 12:
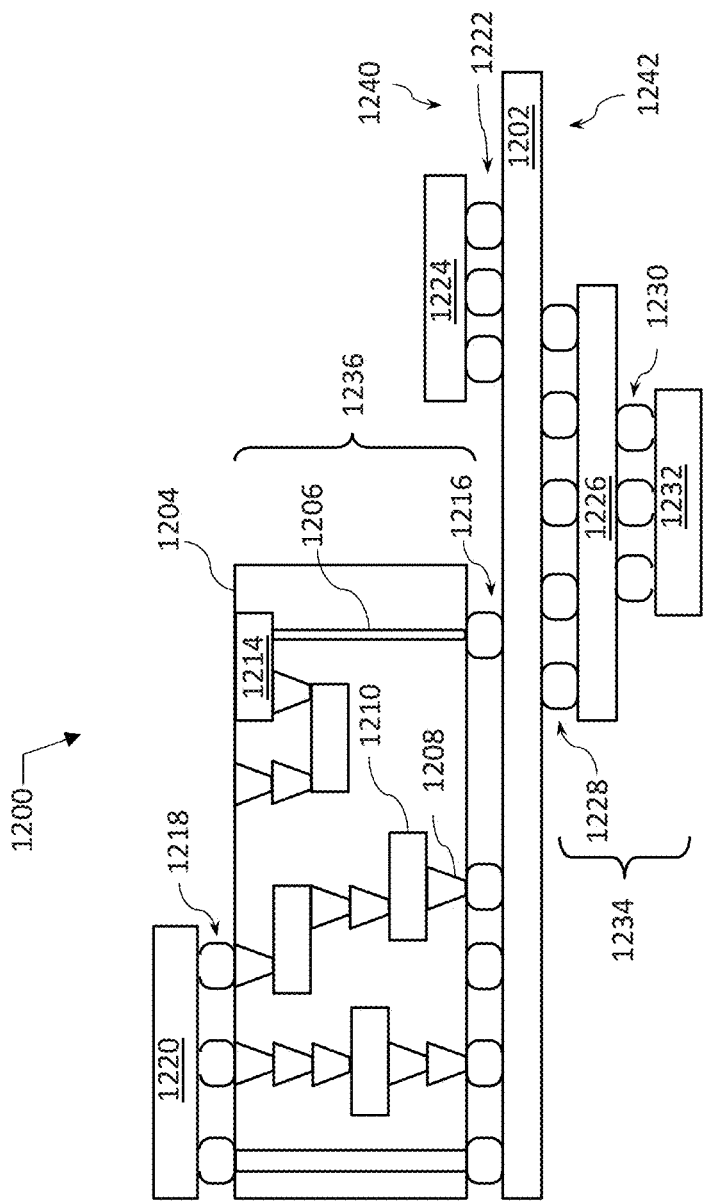
FIG. 12 is a cross-sectional side view of a device assembly that may include one or more of quantum circuit assemblies with vertical FBLs and vertical SQUID loops disclosed herein, in accordance with various embodiments.

FIG. 12 is a cross-sectional side view of a device assembly 1200 that may include any of the vertical SQUID loops and vertical FBLs disclosed herein, e.g., any of those described with reference to FIGS. 1-9. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 12 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 12, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including quantum circuit assemblies with any of the vertical SQUID loops and vertical FBLs described herein, or may be a conventional IC package, for example. In some embodiments, the package 1220 may be implemented as the SC qubit device package 140, shown in FIG. 10. In case the package 1220 is a quantum circuit device package including at least one quantum circuit assembly with any of the vertical SQUID loops and vertical FBLs described herein, at least portions of the vertical SQUID loops and/or vertical FBLs therein may be electrically connected to the interposer 1204 by the coupling components 1218. Generally, the interposer 1204 may spread a connection to a wider pitch or reroute a connection to a different connection. For example, the interposer 1204 may couple the package 1220 (e.g., a die) to a BGA of the coupling components 1216 for coupling to the circuit board 1202. In the embodiment illustrated in FIG. 12, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including one or more quantum circuits with qubits as described herein or may be a conventional IC package, for example. In some embodiments, the package 1224 may take the form of any of the embodiments of the quantum circuit with any of the quantum circuit assemblies with vertical SQUID loops and vertical FBLs as described herein.

The device assembly 1200 illustrated in FIG. 12 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein, e.g., by including the qubit substrates as described herein, or may be a conventional IC package, for example.

Figure 13:
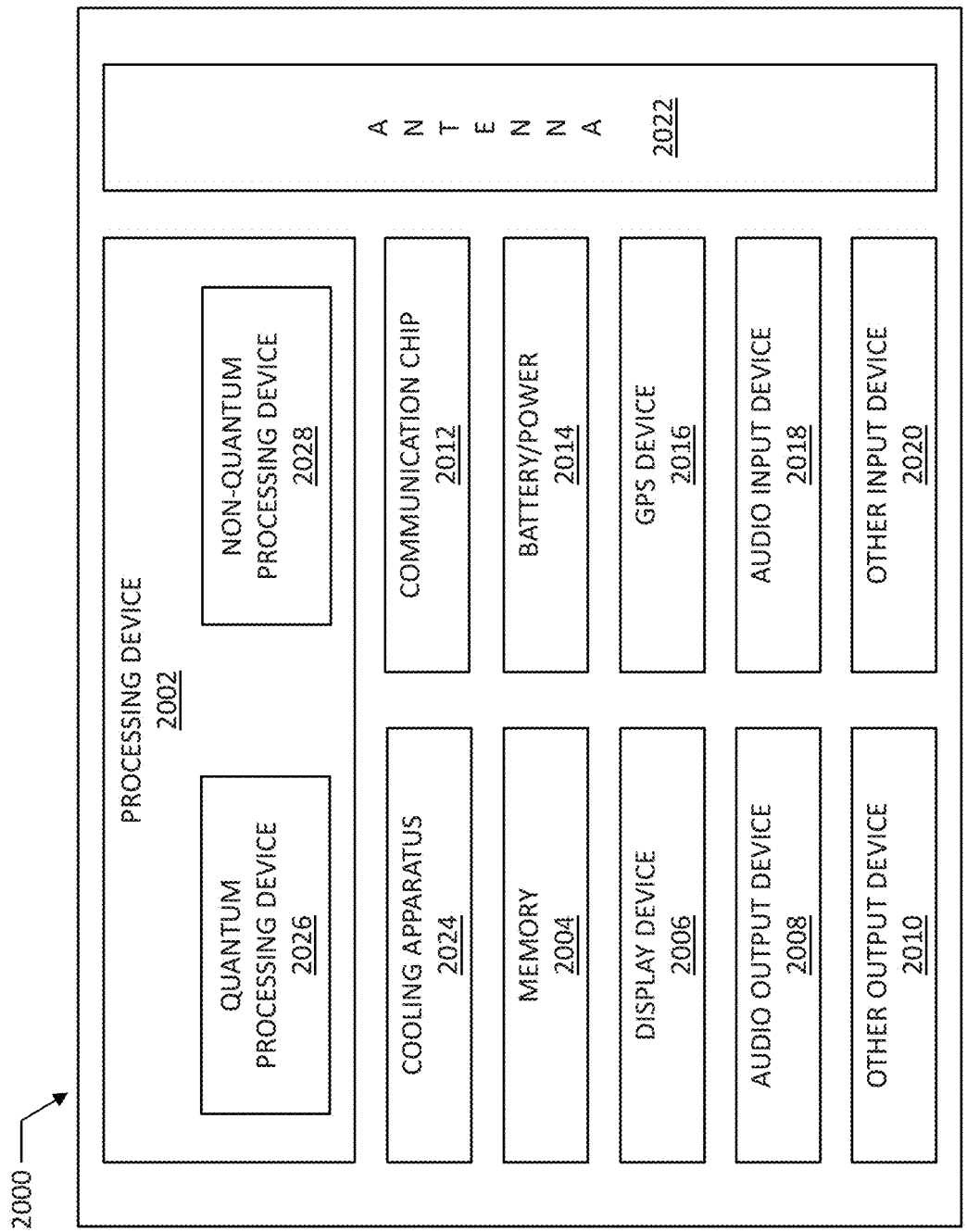
FIG. 13 is a block diagram of an example quantum computing device that may include one or more of quantum circuit assemblies with vertical FBLs and vertical SQUID loops disclosed herein, in accordance with various embodiments.

FIG. 13 is a block diagram of an example quantum computing device 2000 that may include any of the quantum circuit assemblies with vertical SQUID loops and vertical FBLs as disclosed herein, e.g., those described with reference to FIGS. 1-12. A number of components are illustrated in FIG. 13 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 13, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices).

The quantum processing device 2026 may include one or more quantum circuit assemblies including any of the vertical SQUID loops and vertical FBLs disclosed herein. For example, in some embodiments, the quantum processing device 2026 may include one or more quantum circuit assemblies 100 discussed with reference to FIGS. 1-9. In some embodiments, the quantum processing device 2026 may include one or more SC qubit device packages 140 discussed with reference to FIG. 10. In some embodiments, the quantum processing device 2026 may include one or more dies 1102 discussed with reference to FIG. 11. In some embodiments, the quantum processing device 2026 may include one or more device assemblies 1200 discussed with reference to FIG. 12.

The quantum processing device 2026 may perform data processing by performing operations on the qubits that may be generated in the quantum circuit assemblies, and may monitor the result of those operations. For example, different qubits may be allowed to interact, the quantum states of different qubits may be set or transformed, and the quantum states of different qubits may be read, examples of some of which operations have been described above. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control initialization or clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed herein, the display device 2006 discussed herein, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits with any of the vertical SQUID loops and vertical FBLs as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include another output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include another input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

SELECT EXAMPLES

The following paragraphs provide some select examples of various ones of the embodiments disclosed herein.

Example 1 provides a quantum circuit assembly that includes a qubit device provided over a substrate, and further includes an FBL, or an FBL structure, configured to conduct current to tune a frequency of the qubit device. The qubit device includes a SQUID loop that includes two nonlinear inductive elements, e.g., two Josephson Junctions connected, in a loop, by one or more superconductors. The FBL includes a first FBL portion proximate to the SQUID loop, the first FBL portion configured to conduct current in a direction that is substantially perpendicular to the substrate, e.g., in a direction that deviates from a line that is normal/perpendicular to the plane of the substrate by less than about 45 degrees, e.g., by less than about 20 degrees, or by less than about 10 or 5 degrees.

Example 2 provides the quantum circuit assembly according to example 1, where a plane of the SQUID loop is substantially perpendicular to the substrate. As used herein, the term "plane of the SQUID loop" (e.g., plane AA shown in FIG. 4B) may refer to a plane that intersects each of first superconductor electrode, tunnel barrier, and second superconductor electrode of each of the two or more Josephson Junctions implemented as one or more SIS, SNS, or SSS.

Example 3 provides the quantum circuit assembly according to example 2, where the first FBL portion is substantially coplanar to the plane of the SQUID loop or is in a plane substantially parallel to the plane of the SQUID loop. Thus, in other words, the first FBL portion may be substantially perpendicular to a line (e.g., line 438 shown in FIG. 4B) that is normal/perpendicular to the plane of the SQUID loop.

Example 4 provides the quantum circuit assembly according to examples 2 or 3, where a distance from the first FBL portion to the plane of the SQUID loop is less than about 500 micron, including all values and ranges therein, e.g., less than about 100 micron, or less than about 10 micron, or less than about 1 micron.

Example 5 provides the quantum circuit assembly according to any one of the preceding examples, where the first FBL portion is closer to a first Josephson Junction of the two Josephson Junctions than to a second Josephson Junction of the two Josephson Junctions and is outside of an area between the first Josephson Junction and the second Josephson Junction.

Example 6 provides the quantum circuit assembly according to example 5, where a distance from the first FBL portion to the first Josephson Junction is less than about 500 micron, including all values and ranges therein, e.g., less than about 100 micron, or less than about 10 micron, or less than about 1 micron.

Example 7 provides the quantum circuit assembly according to any one of the preceding examples, where the FBL further includes a second FBL portion, the second FBL portion being substantially perpendicular to the substrate (e.g., along a line that deviates from a line that is normal/perpendicular to the plane of the substrate by less than about 45 degrees, e.g., by less than about 20 degrees, or by less than about 10 or 5 degrees).

Example 8 provides the quantum circuit assembly according to example 7, where the second FBL portion is materially/electrically continuous with the first FBL portion.

Example 9 provides the quantum circuit assembly according to examples 7 or 8, where, when the current is conducted in the first FBL portion and the second FBL portion, a magnetic coupling of the first FBL portion to the SQUID loop is greater than a magnetic coupling of the second FBL portion to the SQUID loop, thereby ensuring that a net magnetic coupling is determined predominantly by the first FBL portion.

Example 10 provides the quantum circuit assembly according to any one of examples 7-9, where a distance from the second FBL portion to a plane that is perpendicular to the plane of the SQUID loop and is in a middle between the two Josephson Junctions (i.e., the plane 440 shown in FIG. 4) is less than about 500 micron, including all values and ranges therein, e.g., less than about 100 micron, or less than about 10 micron.

Example 11 provides the quantum circuit assembly according to any one of the preceding examples, where each of the two Josephson Junctions includes a first junction electrode, a tunnel barrier, and a second junction electrode, where the tunnel barrier is between the first junction electrode and the second junction electrode, and the first junction electrode is between the substrate and the tunnel barrier (i.e., the first junction electrode is the bottom junction electrode).

Example 12 provides the quantum circuit assembly according to example 11, where the tunnel barrier includes an insulator.

Example 13 provides the quantum circuit assembly according to example 11, where the tunnel barrier includes a non-superconductive metal.

Example 14 provides the quantum circuit assembly according to example 11, where the tunnel barrier includes a semiconductor.

Example 15 provides the quantum circuit assembly according to any one of examples 11-14, where the SQUID loop further includes a first superconductor element electrically connected to the first junction electrode of each of the two Josephson Junctions, and a second superconductor element electrically connected to the second junction electrode of each of the two Josephson Junctions.

Example 16 provides the quantum circuit assembly according to example 15, where each of the first superconductor element and the second superconductor element is substantially parallel to the substrate.

Example 17 provides the quantum circuit assembly according to examples 15 or 16, where a distance between the first superconductor element and the second superconductor element is between about 20 and 2000 nanometers (nm), including all values and ranges therein, e.g., between about 30 and 1000 nm, or between about 40 and 200 nm.

Example 18 provides the quantum circuit assembly according to any one of examples 15-17, the first superconductor element and the second superconductor element form a shunt capacitor of the qubit device.

Example 19 provides the quantum circuit assembly according to any one of examples 15-18, further including at least one support structure between the first superconductor element and the second superconductor element, configured to mechanically support at least a portion of the second superconductor element over at least a portion of the first superconductor element.

Example 20 provides the quantum circuit assembly according to example 19, where the at least one support structure includes a first end, in contact with the first superconductor element, and a second end, in contact with the second superconductor element.

Example 21 provides the quantum circuit assembly according to examples 19 or 20, where the at least one support structure is an electrical insulator.

Example 22 provides the quantum circuit assembly according to any one of examples 15-21, where at least a portion of the second superconductor element is suspended over at least a portion of the first superconductor element.

Example 23 provides the quantum circuit assembly according to any one of examples 15-22, where the second superconductor element includes a portion forming a bridge or a cantilever over a portion of the first superconductor element.

Example 24 provides the quantum circuit assembly according to any one of examples 1-23, where the FBL structure terminates with a ground connection.

Example 25 provides the quantum circuit assembly according to example 24, where the ground connection is electrically isolated from a common ground plane of the quantum circuit assembly or the qubit device.

Example 26 provides the quantum circuit assembly according to any one of examples 1-23, where the FBL structure includes one input signal connection and one output signal connection.

Example 27 provides the quantum circuit assembly according to any one of the preceding examples, further including a readout resonator, provided either in or out of the qubit plane, configured to detect (readout) a state of the qubit device by capacitively coupling, during operation of the quantum circuit assembly, to a portion of the qubit device.

Example 28 provides the quantum circuit assembly according to any one of the preceding examples, further including a direct drive line, provided either in or out of the qubit plane, configured to set a state of the qubit device by capacitively coupling, during operation of the quantum circuit assembly, to a portion of the qubit device.

Example 29 provides the quantum circuit assembly according to any one of the preceding examples, further including one or more coupling components configured to couple the qubit device to one or more further qubit devices.

Example 30 provides the quantum circuit assembly according to example 29, where the one or more coupling components include one or more coupling resonators.

In some examples, each of one or more of "further qubit devices" of the quantum circuit assembly according to any one of examples 29-30 may be implemented as the qubit device of the quantum circuit assembly according to any one of examples 1-28.

Example 31 provides the quantum circuit assembly according to any one of the preceding examples, where the qubit device is a transmon.

Example 32 provides a method of fabricating a quantum circuit assembly, the method including providing a qubit device over a substrate and providing an FBL configured to conduct current to tune a frequency of the qubit device. The qubit device includes a SQUID loop that includes two nonlinear inductive elements, e.g., two Josephson Junctions connected, in a loop, by one or more superconductors. The FBL includes a first FBL portion proximate to the SQUID loop, the first FBL portion being substantially perpendicular to the substrate, e.g., being along a line that deviates from a line that is normal/perpendicular to the plane of the substrate by less than about 45 degrees, e.g., by less than about 20 degrees, or by less than about 10 or 5 degrees.

Example 33 provides the method according to example 32, where a plane of the SQUID loop is substantially perpendicular to the substrate.

Example 34 provides a quantum IC package that includes a qubit die and a further IC element, coupled to the qubit die. The qubit die includes one or more qubit devices and at least one FBL configured to conduct current to tune one or more frequencies of one or more qubit devices. Each qubit device includes a SQUID loop that includes two nonlinear inductive elements, e.g., two Josephson Junctions connected, in a loop, by one or more superconductors, where a plane of the SQUID loop is substantially perpendicular to the qubit die. The FBL includes a first FBL portion configured to magnetically couple to the SQUID loop of one or more qubit devices.

Example 35 provides the quantum IC package according to example 34, where the further IC element is coupled to the qubit die via one or more interconnects between the further IC element and the qubit die.

Example 36 provides the quantum IC package according to examples 34 or 35, where the further IC element is one of an interposer, a circuit board, a flexible board, or a package substrate.

In various further examples, each qubit device of the quantum IC package according to any one of examples 34-36 may be implemented as the qubit device of the quantum circuit assembly according to any one of the preceding examples (e.g., examples 1-31).

Example 37 provides a quantum computing device that includes a quantum processing device that includes a qubit die including a quantum circuit assembly according to any one of the preceding examples, the quantum circuit assembly including a plurality of superconducting qubits. The qubit die further includes at least one FBL configured to tune a qubit frequency of one or more of the plurality of superconducting qubits, the FBL including a first FBL portion proximate to the one or more of the plurality of superconducting qubits, the first FBL portion being substantially perpendicular to the qubit die. The quantum computing device further includes a memory device configured to store data generated by the plurality of superconducting qubits during operation of the quantum processing device.

Example 38 provides the quantum computing device according to example 37, further including a cooling apparatus configured to maintain a temperature of the quantum processing device below 5 degrees Kelvin.

Example 39 provides the quantum computing device according to examples 37 or 38, where the memory device is configured to store instructions for a quantum computing algorithm to be executed by the quantum processing device.

Example 40 provides the quantum computing device according to any one of examples 37-39, further including a non-quantum processing device coupled to the quantum processing device.

In various further examples, at least some of the plurality of qubits of the quantum computing device according to any one of examples 37-40 may be implemented as the quantum circuit assembly according to any one of the preceding examples (e.g., any one of examples 1-31). In still further examples, the quantum computing device according to any one of examples 37-40 may include the quantum IC package according to any one of the preceding examples (e.g., examples 34-36).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A quantum circuit assembly, comprising:
   a qubit device over a substrate, the qubit device comprising a superconducting quantum interference device (SQUID) loop that includes two Josephson Junctions; and
   a flux bias line (FBL) structure, the FBL structure configured to generate a magnetic field to extend to the SQUID loop,
   wherein the FBL structure includes a first FBL portion, configured to conduct current in a direction substantially perpendicular to the substrate.

2. The quantum circuit assembly according to claim 1, wherein a plane of the SQUID loop is substantially perpendicular to the substrate.

3. The quantum circuit assembly according to claim 2, wherein the first FBL portion is coplanar to the plane of the SQUID loop or is in a plane parallel to the plane of the SQUID loop.

4. The quantum circuit assembly according to claim 2, wherein a distance from the first FBL portion to the plane of the SQUID loop is less than 500 micron.

5. The quantum circuit assembly according to claim 1, wherein the first FBL portion is closer to a first Josephson Junction of the two Josephson Junctions than to a second Josephson Junction of the two Josephson Junctions and is outside of an area between the first Josephson Junction and the second Josephson Junction.

6. The quantum circuit assembly according to claim 1, wherein the FBL further comprises a second FBL portion, the second FBL portion being substantially perpendicular to the substrate.

7. The quantum circuit assembly according to claim 6, wherein the second FBL portion is materially continuous with the first FBL portion.

8. The quantum circuit assembly according to claim 6, wherein, when the current is conducted in the first FBL portion and the second FBL portion, a magnetic coupling of the first FBL portion to the SQUID loop is greater than a magnetic coupling of the second FBL portion to the SQUID loop.

9. The quantum circuit assembly according to claim 6, wherein a distance from the second FBL portion to a plane that is perpendicular to the plane of the SQUID loop and is in a middle between the two Josephson Junctions is less than 500 micron.

10. The quantum circuit assembly according to claim 1, wherein each of the two Josephson Junctions includes:
    a first junction electrode,
    a tunnel barrier, and
    a second junction electrode,
    wherein the tunnel barrier is between the first junction electrode and the second junction electrode, and the first junction electrode is between the substrate and the tunnel barrier.

11. The quantum circuit assembly according to claim 10, wherein the tunnel barrier includes one of:
    an insulator,
    a non-superconductive metal, and
    a semiconductor.

12. The quantum circuit assembly according to claim 10, wherein the SQUID loop further includes:
    a first superconductor element coupled to the first junction electrode of each of the two Josephson Junctions, and
    a second superconductor element coupled to the second junction electrode of each of the two Josephson Junctions,
    wherein each of the first superconductor element and the second superconductor element is parallel to the substrate.

13. The quantum circuit assembly according to claim 12, the first superconductor element and the second superconductor element form a shunt capacitor of the qubit device.

14. The quantum circuit assembly according to claim 12, further comprising at least one support structure between the first superconductor element and the second superconductor element, wherein the at least one support structure includes:
    a first end, in contact with the first superconductor element, and
    a second end, in contact with the second superconductor element.

15. The quantum circuit assembly according to claim 12, wherein:
    at least a portion of the second superconductor element is suspended over at least a portion of the first superconductor element, or
    the second superconductor element includes a portion forming a bridge or a cantilever over a portion of the first superconductor element.

16. The quantum circuit assembly according to claim 1, wherein the FBL structure terminates with a ground connection.

17. The quantum circuit assembly according to claim 16, wherein the ground connection is electrically isolated from a common ground plane of the quantum circuit assembly or the qubit device.

18. The quantum circuit assembly according to claim 1, wherein the FBL structure includes one input signal connection and one output signal connection.

19. The quantum circuit assembly according to claim 1, further comprising one or more of:

a readout resonator, configured to detect a state of the qubit device, a direct drive line, configured to set a state of the qubit device, and one or more coupling resonators configured to couple the qubit device to one or more further qubit devices.

20. A method of fabricating a quantum circuit assembly, the method comprising:

providing a qubit device over a substrate, the qubit device comprising a superconducting quantum interference device (SQUID) loop that includes two nonlinear inductive elements; and providing a flux bias line (FBL) structure, the FBL structure configured to generate a magnetic field to extend to the SQUID loop, wherein the FBL structure includes a first FBL portion, configured to conduct current in a direction substantially perpendicular to the substrate.

21. The method according to claim 20, wherein a plane of the SQUID loop is perpendicular to the substrate.

22. A quantum integrated circuit (IC) package, comprising:

a qubit die; and a further IC element, coupled to the qubit die, wherein the qubit die includes:

one or more qubit devices, where at least one of the one or more qubit devices includes a superconducting quantum interference device (SQUID) loop that includes two Josephson Junctions, at least one flux bias line (FBL) structure, the FBL structure configured to generate a magnetic field to extend to the SQUID loop, and the FBL structure includes a first FBL portion configured to conduct current in a direction substantially perpendicular to the qubit die.

23. The quantum IC package according to claim 22, wherein the further IC element is one of an interposer, a circuit board, a flexible board, or a package substrate.

24. A quantum computing device, comprising:

a quantum processing device that includes:

a qubit die comprising a plurality of superconducting qubits, where at least one of the plurality of superconducting qubits includes a superconducting quantum interference device (SQUID) loop that includes two Josephson Junctions, and at least one flux bias line (FBL) structure, the FBL structure configured to generate a magnetic field to extend to the SQUID loop, where the FBL structure includes a first FBL portion, configured to conduct current in a direction substantially perpendicular to the qubit die; and a memory device configured to store data generated by the plurality of superconducting qubits during operation of the quantum processing device.

25. The quantum computing device according to claim 24, further comprising a cooling apparatus configured to maintain a temperature of the quantum processing device below 5 degrees Kelvin.

* * * * *